(12) United States Patent
Lee et al.

(10) Patent No.: US 7,598,615 B2
(45) Date of Patent: Oct. 6, 2009

(54) ANALYTIC STRUCTURE FOR FAILURE ANALYSIS OF SEMICONDUCTOR DEVICE HAVING A MULTI-STACKED INTERCONNECTION STRUCTURE

(75) Inventors: Ki-Am Lee, Yongin-si (KR); Jong-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 591 days.

(21) Appl. No.: 11/346,678

(22) Filed: Feb. 3, 2006

(65) Prior Publication Data
US 2006/0175668 A1 Aug. 10, 2006

(30) Foreign Application Priority Data
Feb. 7, 2005 (KR) ...................... 10-2005-0011297

(51) Int. Cl.
*H01L 23/485* (2006.01)
*H01L 23/528* (2006.01)
(52) U.S. Cl. ................ 257/758; 257/775; 257/E23.019; 257/E23.145
(58) Field of Classification Search ................. 257/508, 257/751, 758, 760, 776, 775, E23.485, E23.528
See application file for complete search history.

(56) References Cited
U.S. PATENT DOCUMENTS
6,197,685 B1 3/2001 Domae et al. ............... 438/648

| | | | | |
|---|---|---|---|---|
| 6,534,864 | B1 * | 3/2003 | Tanaka et al. ............... | 257/751 |
| 6,580,176 | B2 | 6/2003 | Domae et al. ............... | 257/798 |
| 6,693,446 | B2 | 2/2004 | Song et al. .................. | 324/719 |
| 6,822,330 | B2 * | 11/2004 | Park et al. .................... | 257/758 |
| 7,468,530 | B2 * | 12/2008 | Lee et al. ..................... | 257/207 |
| 2003/0034558 | A1 | 2/2003 | Umemura et al. ........... | 257/734 |
| 2006/0220240 | A1 * | 10/2006 | Lee et al. ..................... | 257/734 |

FOREIGN PATENT DOCUMENTS

| JP | 11-031727 | 2/1999 |
|---|---|---|
| KR | 10-2002-0093391 | 12/2002 |
| KR | 10-2003-0009816 | 2/2003 |

* cited by examiner

*Primary Examiner*—Anh D Mai
(74) *Attorney, Agent, or Firm*—Mills & Onello LLP

(57) ABSTRACT

In an analytic structure for failure analysis of a semiconductor device, a plurality of analytic regions are arranged in regions of a semiconductor substrate. A plurality of semiconductor transistors having an array structure are arranged in each of the analytic regions. A plurality of interconnection structures connect the semiconductor transistors, each comprising multiple layered metal patterns and multiple layered plugs interposed between the multiple layered metal patterns. A first number of layers of the multiple layered metal patterns and multiple layered plugs is different in one of the analytic regions than a second number of layers of the multiple layered metal patterns and multiple layered plugs in another one of the analytic regions.

9 Claims, 23 Drawing Sheets

Fig. 9A

| ▲ | Above Standard | First Region (L2 Structure) | | |
|---|---|---|---|---|
| ⊙ | Standard | Structure /Use | Process Margin | Possibility for Failure Generation |
| ▽ | Below Standard | | | |
| Gate | | WORD LINE | ⊙ OR ▲ | ⊙ OR ▽ |
| Contact Hole | | | ⊙ OR ▲ | ⊙ OR ▽ |
| Contact Plug | | | ⊙ OR ▲ | ⊙ OR ▽ |
| First Metal Pattern | | LANDING PAD | ⊙ OR ▲ | ⊙ OR ▽ |
| First Via Hole | | | ⊙ | ⊙ |
| First Via Plug | | | ⊙ | ⊙ |
| Second Metal Pattern | | BIT LINE | ⊙ | ⊙ |

Fig. 9B

| ▲ | Above Standard | Second Region (L3 Structure) | | |
|---|---|---|---|---|
| ⊙ | Standard | Structure /Use | Process Margin | Possibility for Failure Generation |
| ▽ | Below Standard | | | |
| Gate | | WORD LINE | ⊙ OR ▲ | ⊙ OR ▽ |
| Contact Hole | | | ⊙ OR ▲ | ⊙ OR ▽ |
| Contact Plug | | | ⊙ OR ▲ | ⊙ OR ▽ |
| First Metal Pattern | | LANDING PAD | ⊙ OR ▲ | ⊙ OR ▽ |
| First Via Hole | | | ⊙ OR ▲ | ⊙ OR ▽ |
| First Via Plug | | | ⊙ OR ▲ | ⊙ OR ▽ |
| Second Metal Pattern | | LANDING PAD | ⊙ OR ▲ | ⊙ OR ▽ |
| Second Via Hole | | | ⊙ | ⊙ |
| Second Via Plug | | | ⊙ | ⊙ |
| Third Metal Pattern | | BIT LINE | ⊙ | ⊙ |

Fig. 9C

| ▲ | Above Standard | Third Region (L4 Structure) | | |
|---|---|---|---|---|
| ⊙ | Standard | Structure /Use | Process Margin | Possibility for Failure Generation |
| ▽ | Below Standard | | | |
| Gate | | WORD LINE | ⊙ OR ▲ | ⊙ OR ▽ |
| Contact Hole | | | ⊙ OR ▲ | ⊙ OR ▽ |
| Contact Plug | | | ⊙ OR ▲ | ⊙ OR ▽ |
| First Metal Pattern | | LANDING PAD | ⊙ OR ▲ | ⊙ OR ▽ |
| First Via Hole | | | ⊙ OR ▲ | ⊙ OR ▽ |
| First Via Plug | | | ⊙ OR ▲ | ⊙ OR ▽ |
| Second Metal Pattern | | LANDING PAD | ⊙ OR ▲ | ⊙ OR ▽ |
| Second Via Hole | | | ⊙ OR ▲ | ⊙ OR ▽ |
| Second Via Plug | | | ⊙ OR ▲ | ⊙ OR ▽ |
| Third Metal Pattern | | LANDING PAD | ⊙ OR ▲ | ⊙ OR ▽ |
| Third Via Hole | | | ⊙ | ⊙ |
| Third Via Plug | | | ⊙ | ⊙ |
| Fourth Metal Pattern | | BIT LINE | ⊙ | ⊙ |

Fig. 9D

| ▲ | Above Standard | Fourth Region (L5 Structure) | | |
|---|---|---|---|---|
| ⊙ | Standard | Structure /Use | Process Margin | Possibility for Failure Generation |
| ▽ | Below Standard | | | |
| Gate | | WORD LINE | ⊙ OR ▲ | ⊙ OR ▽ |
| Contact Hole | | | ⊙ OR ▲ | ⊙ OR ▽ |
| Contact Plug | | | ⊙ OR ▲ | ⊙ OR ▽ |
| First Metal Pattern | | LANDING PAD | ⊙ OR ▲ | ⊙ OR ▽ |
| First Via Hole | | | ⊙ OR ▲ | ⊙ OR ▽ |
| First Via Plug | | | ⊙ OR ▲ | ⊙ OR ▽ |
| Second Metal Pattern | | LANDING PAD | ⊙ OR ▲ | ⊙ OR ▽ |
| Second Via Hole | | | ⊙ OR ▲ | ⊙ OR ▽ |
| Second Via Plug | | | ⊙ OR ▲ | ⊙ OR ▽ |
| Third Metal Pattern | | LANDING PAD | ⊙ OR ▲ | ⊙ OR ▽ |
| Third Via Hole | | | ⊙ OR ▲ | ⊙ OR ▽ |
| Third Via Plug | | | ⊙ OR ▲ | ⊙ OR ▽ |
| Fourth Metal Pattern | | LANDING PAD | ⊙ OR ▲ | ⊙ OR ▽ |
| Fourth Via Hole | | | ⊙ | ⊙ |
| Fourth Via Plug | | | ⊙ | ⊙ |
| Fifth Metal Pattern | | BIT LINE | ⊙ | ⊙ |

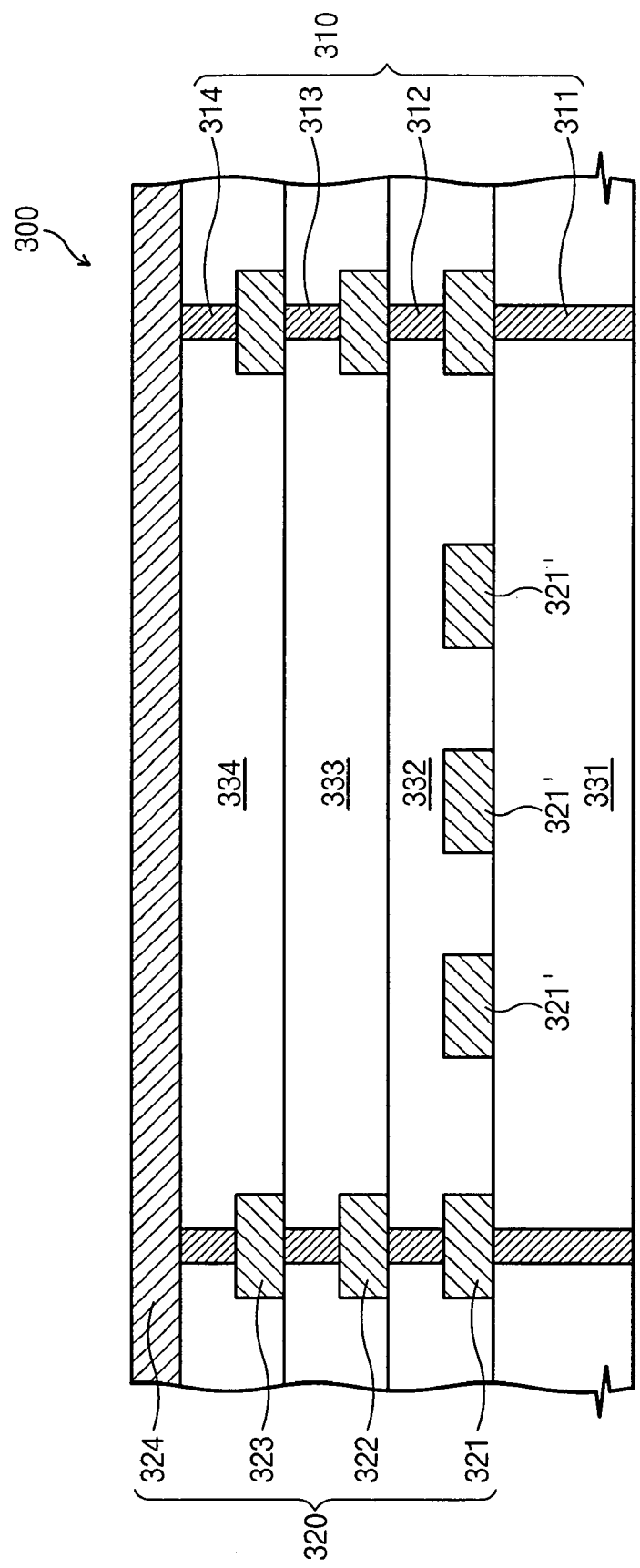

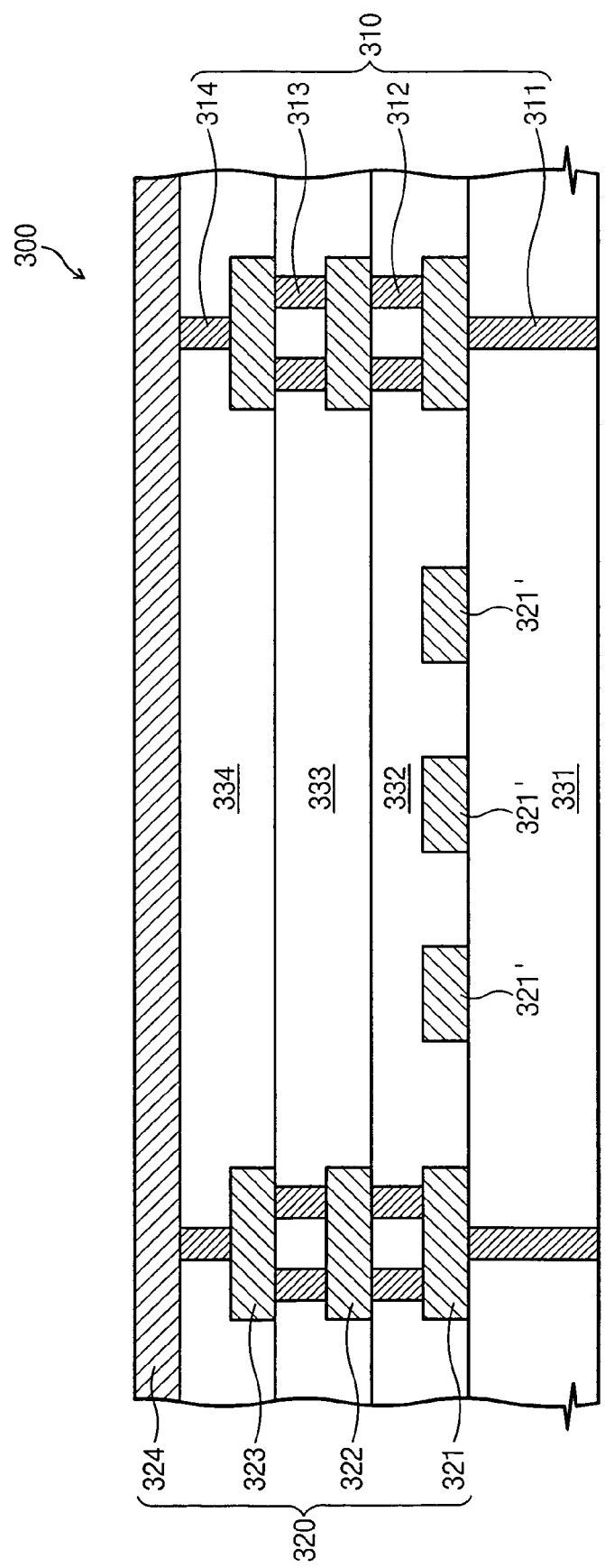

ANALYTIC STRUCTURE FOR FAILURE ANALYSIS OF SEMICONDUCTOR DEVICE HAVING A MULTI-STACKED INTERCONNECTION STRUCTURE

CROSS-REFERENCE TO RELATED APPLICATION

This application claims priority from Korean Patent Application No. 10-2005-0011297, filed on Feb. 7, 2005, the disclosure of which is hereby incorporated herein by reference in its entirety as if set forth fully herein.

BACKGROUND OF THE INVENTION

1. Field of the Invention

The present invention relates to failure analysis of a semiconductor device, and more particularly to an analytic structure for failure analysis of a semiconductor device.

2. Description of the Related Art

Generally, in the mass production of a semiconductor device, the securing of a stabilized production technology capable of maintaining a profitable yield is desired. A development procedure of the semiconductor device is a series of procedures including a designing procedure, a procedure for a pilot production, and a procedure of testing the pilot-fabricated products, in order to secure stabilized production technology. Meanwhile, a failure analysis is a series of feedback procedures that are designed to determine the causes for failures in the pilot-fabricated semiconductor devices, and to improve them.

In particular, since methods of designing and fabricating the semiconductor device may be changed according to the result of the failure analysis, an adequate failure analysis is very important in the development procedure of the semiconductor device. Accordingly, an erroneous failure analysis can delay the development period of products by increasing the amount of trial and error needed to reach development. In this point of view, a rapid and accurate failure analysis is very important for securing a short development period and preemption over markets of semiconductor devices.

In general, in order to analyze failures efficiently, test patterns are formed on a semiconductor wafer according to various design rules. Various electrical measurements performed for the test patterns are used for evaluating structural or electrical properties of various microscopic electronic devices. For this reason, the test patterns are designed to monitor the structural/electrical properties of elements constituting the semiconductor device.

Fabrication processes of the semiconductor device can be primarily classified into a front-end process incorporating a plurality of steps carried out until a transistor is formed and a back-end process following formation of the transistor. Herein, the back-end process generally involves formation of interconnect structures that connect the transistors and a process for forming an interlayer dielectric layer which operates to mechanically support and electrically insulate the interconnection structures. U.S. Patent Publication No. 2003-034558 (Eiichi Umemura, et al.) discloses a technology with regard to an inspection pattern having a contact chain structure in order to evaluate the back-end process. In the Umemura, et al. disclosure, although it is possible to recognize that failures with regard to interconnections, e.g., failures of interconnections such as short or open, have occurred, it is impossible to obtain detailed information with regard to types or locations of the failures.

When accurate locations of the failures are determined, a portion of a semiconductor substrate corresponding to those locations can be accurately cut off by using a focused ion beam (FIB) or the like and it is possible to visually enlarge a cut section for failure analysis using a scanning electron microscope (SEM). However, when the accurate locations of the failures are not known, a plurality of wafer cutting processes are required for obtaining enlarged visual information which can be used for failure analysis. That is, provided that the failures exist in the cut section during the wafer cutting process, the failures may be enlarged so that they can be analyzed through the SEM. On the contrary, if there is not accurate information with regard to the locations of the failures, it is not certain whether the locations of the failures exist in the cut section. As a result, it may be necessary to carry out the wafer cutting process many times. In particular, in the case of analyzing the semiconductor device having limited number of failures therein, a wafer specimen may be damaged during an inaccurate wafer cutting process so that it may be impossible to analyze the failures. In this case, since the causes for the failures are not discovered, development time may be further delayed.

SUMMARY OF THE INVENTION

The present invention provides an analytic structure capable of analyzing failures generated in a back-end process of fabricating a semiconductor device.

The present invention also provides an analytic structure capable of determining accurate locations of failures generated in a back-end process of fabricating a semiconductor device.

The present invention further provides an analytic structure capable of readily determining the types of failures generated in a fabrication of a semiconductor device having multi-stacked interconnection structure.

The present invention further provides an analytic structure capable of readily determining vertical locations of interconnection failures generated in a fabrication of a semiconductor device having a multi-stacked interconnection structure.

In one aspect, the present invention is directed to an analytic structure for failure analysis of a semiconductor device. A plurality of analytic regions are arranged in regions of a semiconductor substrate. A plurality of semiconductor transistors having an array structure are arranged in each of the analytic regions. A plurality of interconnection structures connect the semiconductor transistors in each of the analytic regions, each interconnection structure comprising multiple layered metal patterns and multiple layered plugs interposed between the multiple layered metal patterns. A first number of layers of the multiple layered metal patterns and multiple layered plugs is different in one of the analytic regions than a second number of layers of the multiple layered metal patterns and multiple layered plugs in another one of the analytic regions.

In one embodiment, a plug is disposed vertically over another underlying plug in at least one analytic region thereby forming a stacked via structure.

In another embodiment, the interconnection structures include word line structures connected to gate electrodes of the semiconductor transistors.

In another embodiment, the interconnection structures include source line structures connected to source electrodes of the semiconductor transistors.

In another embodiment, the interconnection structures include drain line structures connected to drain electrodes of the semiconductor transistors.

In another embodiment, the semiconductor transistors are formed of an SRAM (static random access memory) cell array, each cell comprising two load transistors, two drive transistors and two access transistors.

In another embodiment, the plugs comprise multi-via structures where a plurality of plugs are disposed over the underlying metal pattern in at least one analytic region.

In another embodiment, an area of a metal pattern formed at a predetermined layer of an analytic region is determined according to a location of the analytic region.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 2A through 7A are plane views of an analytic structure according to an embodiment of the present invention;

FIGS. 2B through 7B are cross sectional views taken along the lines I-I' of FIGS. 2A through 7A;

FIGS. 2C through 7C are cross sectional views taken along the lines II-II' of FIGS. 2A through 7A;

FIGS. 9A through 9D are tables representing a process margin applied to each process illustrating a fabrication method according to an embodiment of the present invention;

FIGS. 11B and 11C are cross sectional views taken along the lines III-III' and IV-IV' of FIG. 11A;

FIG. 12B is a cross sectional view taken along the line IV-IV' of FIG. 12A.

DETAILED DESCRIPTION OF THE INVENTION

Figure 1:
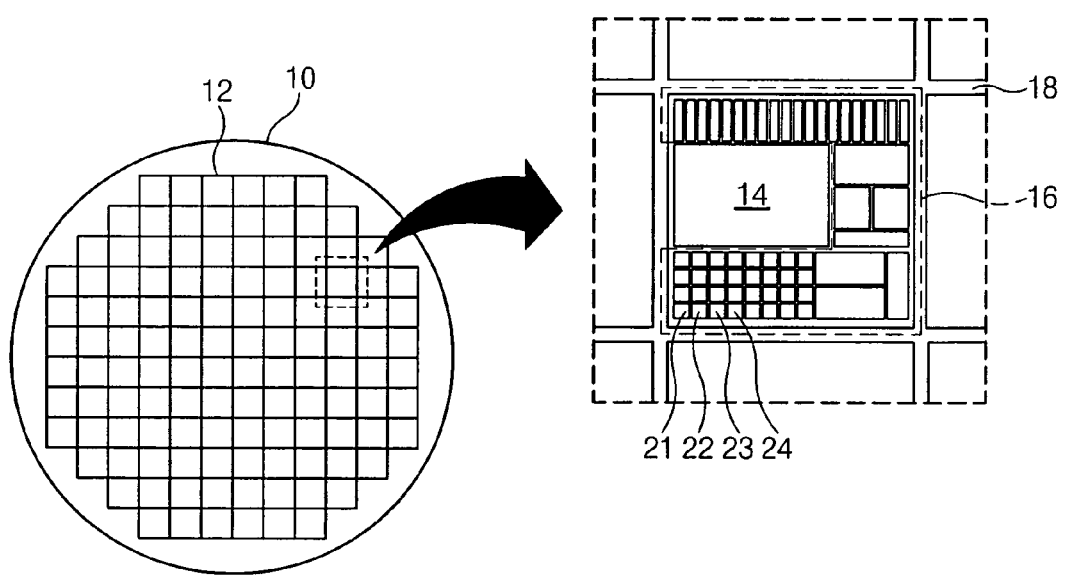
FIG. 1 is a schematic view illustrating an analytic structure according to the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a schematic view illustrating an analytic structure according to the present invention.

Referring to FIG. 1, a plurality of dies 12 are allocated in a semiconductor wafer 10, wherein each die 12 is provided with a product region 14 and auxiliary regions 16. The plurality of dies 12 are separated from one another through a wafer scribing process so that they can be used for a semiconductor product. The product region 14 is a region which will be used for the semiconductor product and the auxiliary regions 16 are regions where analytic structures for evaluating appropriateness of a fabrication process are allocated. The area of the auxiliary region 16 becomes reduced when a development procedure for the semiconductor product is changed into a step for mass production. In particular, the auxiliary region 16 may not be allocated inside the die 12 but rather at a cutting, or scribe, region 18 between the dies 12.

The analytic structure can include test patterns formed according to various design rules, in order to determine a suitable process method that is capable of securing process stability. In more detail, the analytic structure can include front-end analytic structures for evaluating process stability of a fabrication process for a transistor and back-end analytic structures for evaluating process stability of post processes after the formation of the transistor such as a process of forming an interconnection.

The front-end analytic structures may be provided with transistors of predetermined structures modified by various types. By carrying out an electrical test of various items for the front-end analytic structures, it is possible to optimize the fabrication process of the transistors constituting the semiconductor product.

Likewise, the back-end analytic structures may be provided with interconnection structures of predetermined structures modified by various types. By carrying out an electrical test of various items for the back-end analytic structures, it is possible to optimize the process of forming the interconnection structures. In general, the interconnection structures may include a contact plug, a via plug, a metal pattern, a metal line or the like. Accordingly, through a test for the back-end analytic structures, it is possible to find out the causes of the failures generated in processes of forming and patterning an interlayer dielectric layers, a process of filling plug contact layers, processes of forming and patterning metal layers and so forth.

In order to readily analyze the failures generated in the interconnection structures, the interconnection structures are allocated to connect the transistors of an array structure. As will be described in detail below, it is possible to determine horizontal locations of the failures, i.e., locations of cells where the failures are generated, by using the transistor array. In addition, the analytic structures are configured in such a manner that each part of the interconnection structures for use in the semiconductor device can be tested independently. In order to independently test each part, the present invention can include a plurality of interconnection structures, wherein each one has a different structure. Likewise, as will be fully described below, it is possible to readily analyze vertical locations of the failures, i.e., location of layers where the failures are generated, by using the different interconnection structures. According to the present invention, each of the interconnection structures may be allocated at a respective auxiliary region 16.

FIGS. 2A through 7A are plane views of an analytic structure according to an embodiment of the present invention. FIGS. 2B through 7B and FIGS. 2C through 7C are cross sectional views taken along the lines I-I' and the lines II-II' of FIGS. 2A through 7A respectively.

According to the present invention, referring to FIG. 1, a plurality of analytic regions are allocated in one die 12, wherein the number of layers and the structure of each analytic region are different from the others. In detail, the following embodiments correspond to the back-end analytic structures of the semiconductor device having a first, a second, a third, a fourth and a fifth metal layers so that four analytic regions such as a first, a second, a third and a fourth analytic regions 21, 22, 23 and 24 are allocated in one die 12. According to the number of layers constituting the semiconductor device, it is possible to change the number and the structures of the analytic regions. According to the following embodiments, the first analytic region is structured to determine the failures in the first and the second metal layers and the second analytic region is structured to determine the failures generated in the third metal layer. In addition, the third analytic region is structured to determine the failures generated in the fourth metal layer and the fourth analytic region is structured to determine the failures generated in the fifth metal layer. The present invention is not limited to the above configuration, and various modifications can be made.

FIGS. 2A through 2C and FIGS. 3A through 3C show transistor structures and a process of forming a first metal pattern. Herein, the analytic regions 21, 22, 23 and 24 have the same structure.

Figure 2A:
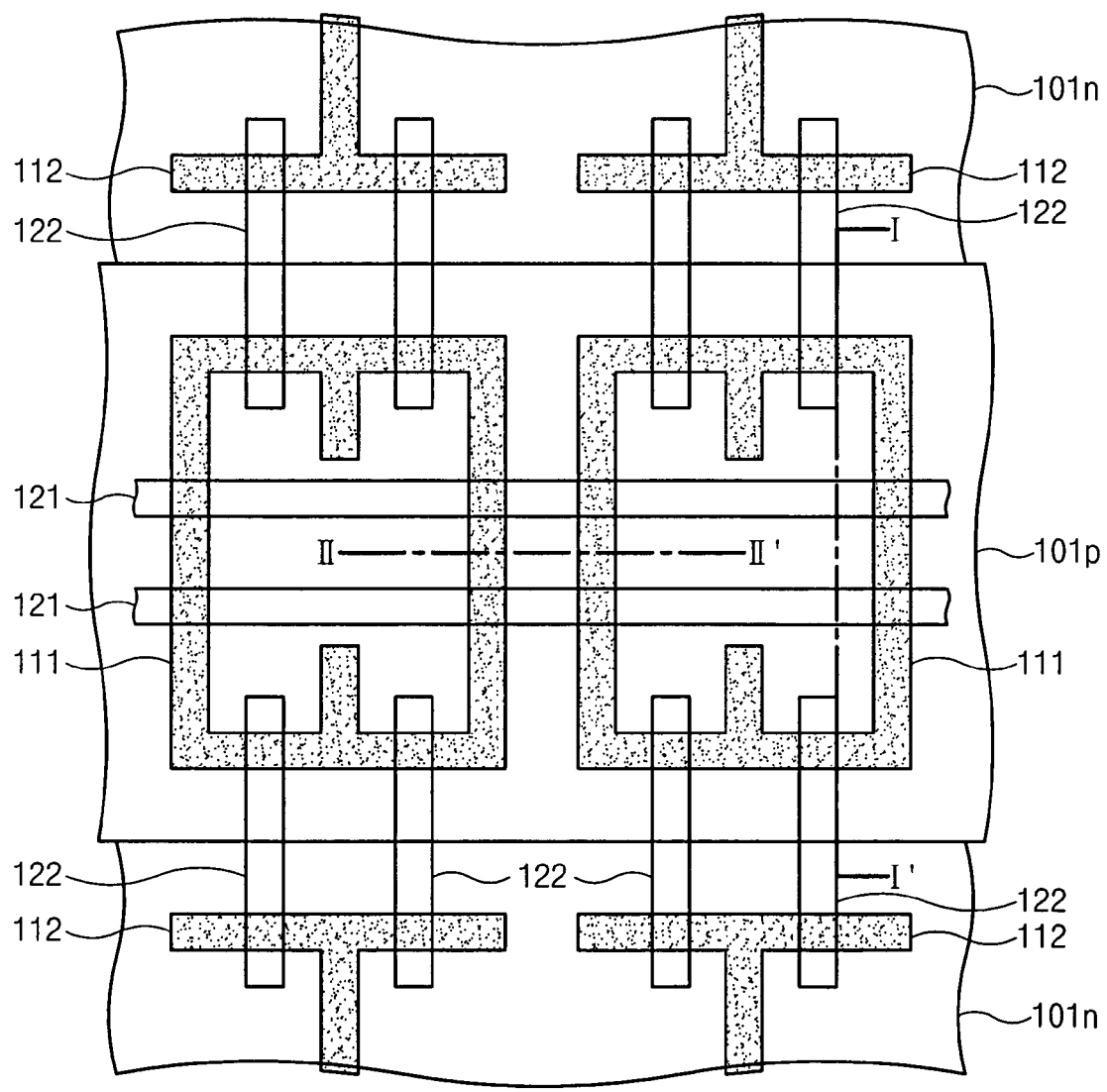
Figure 2B:
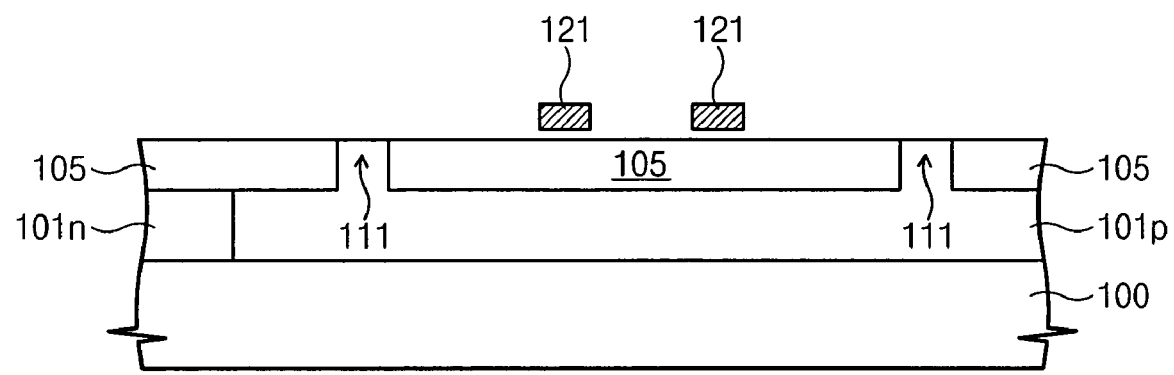
Figure 2C:
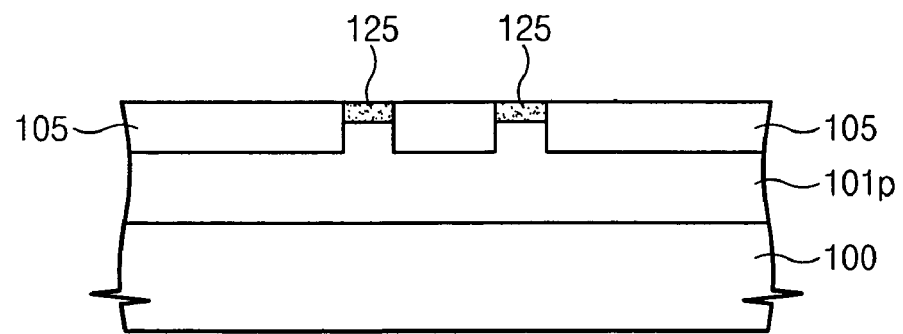
Figure 3A:
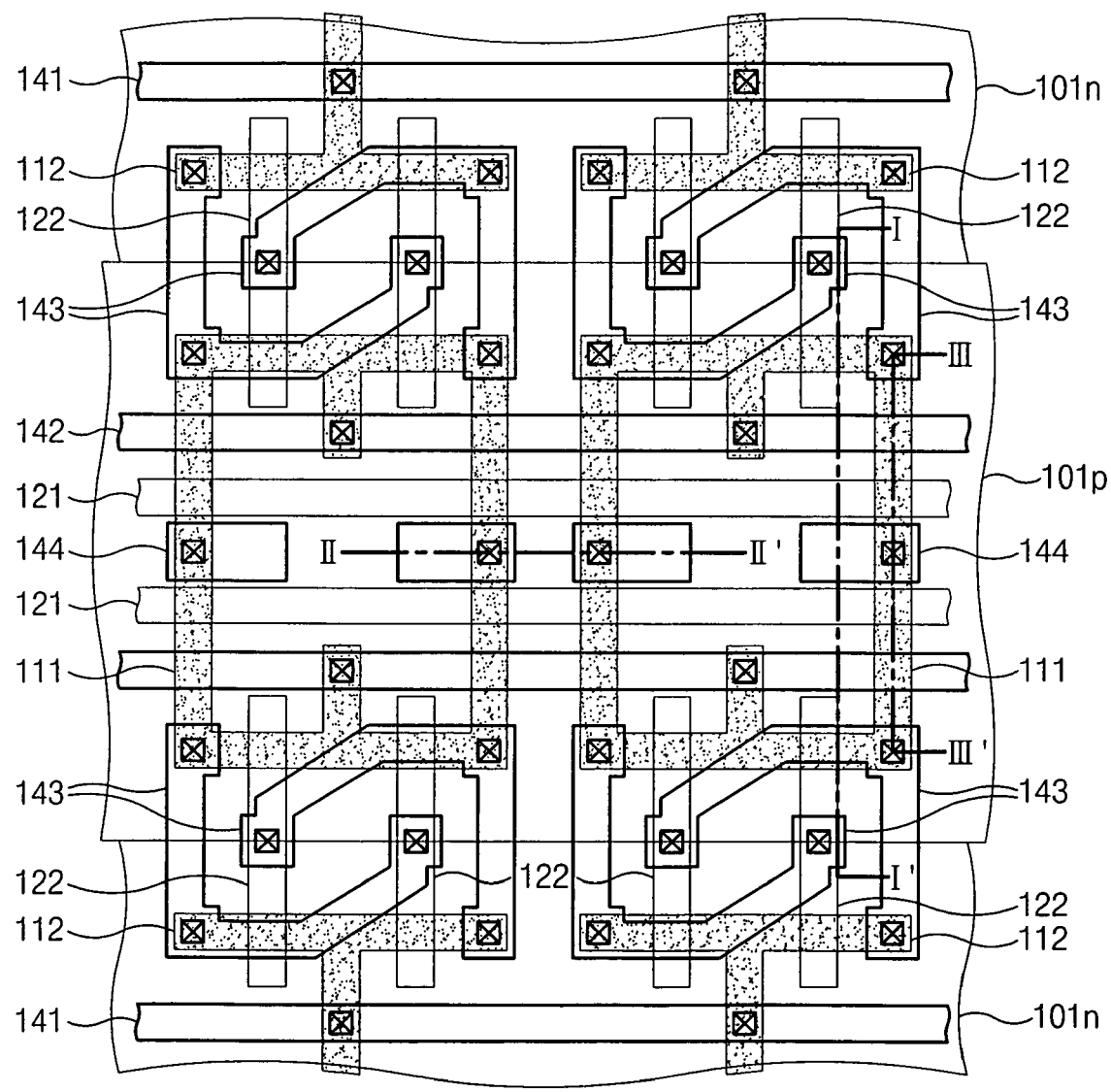
Figure 3B:
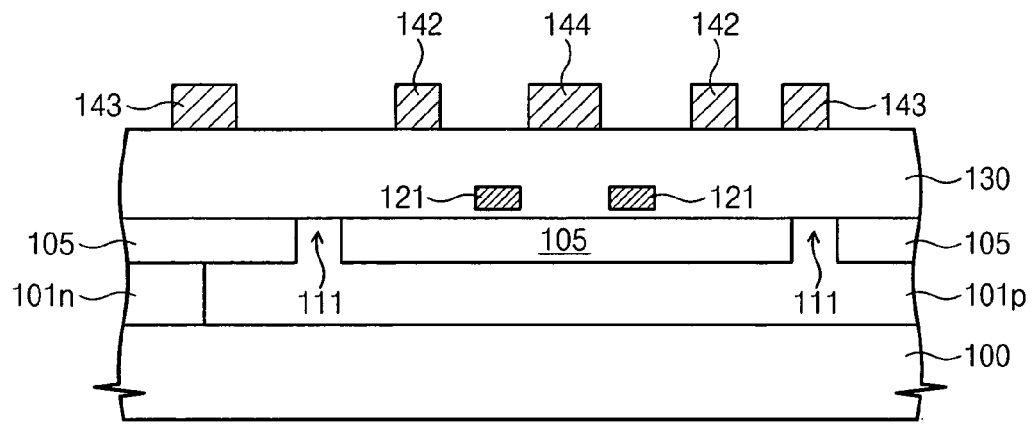
Figure 3C:
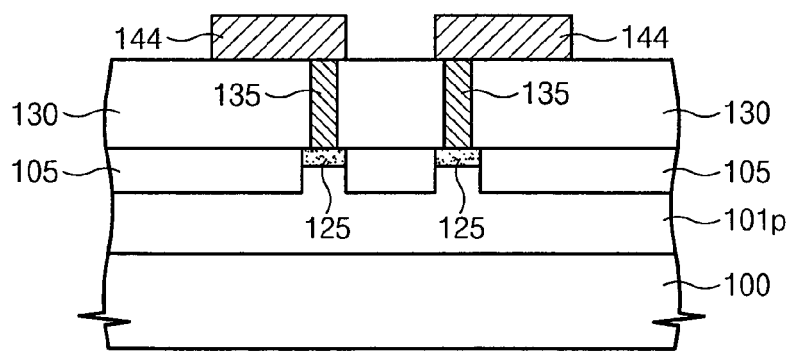
Figure 3D:
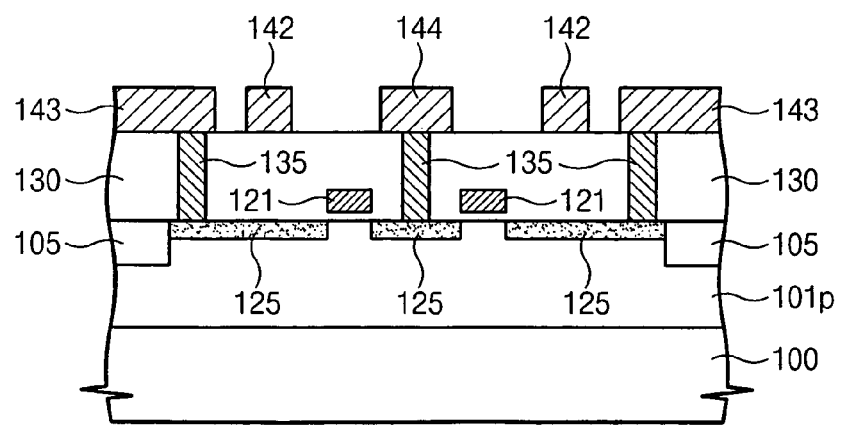
FIG. 3D is a cross sectional view taken along the lines III-III' of FIG. 3A.
Figure 8:
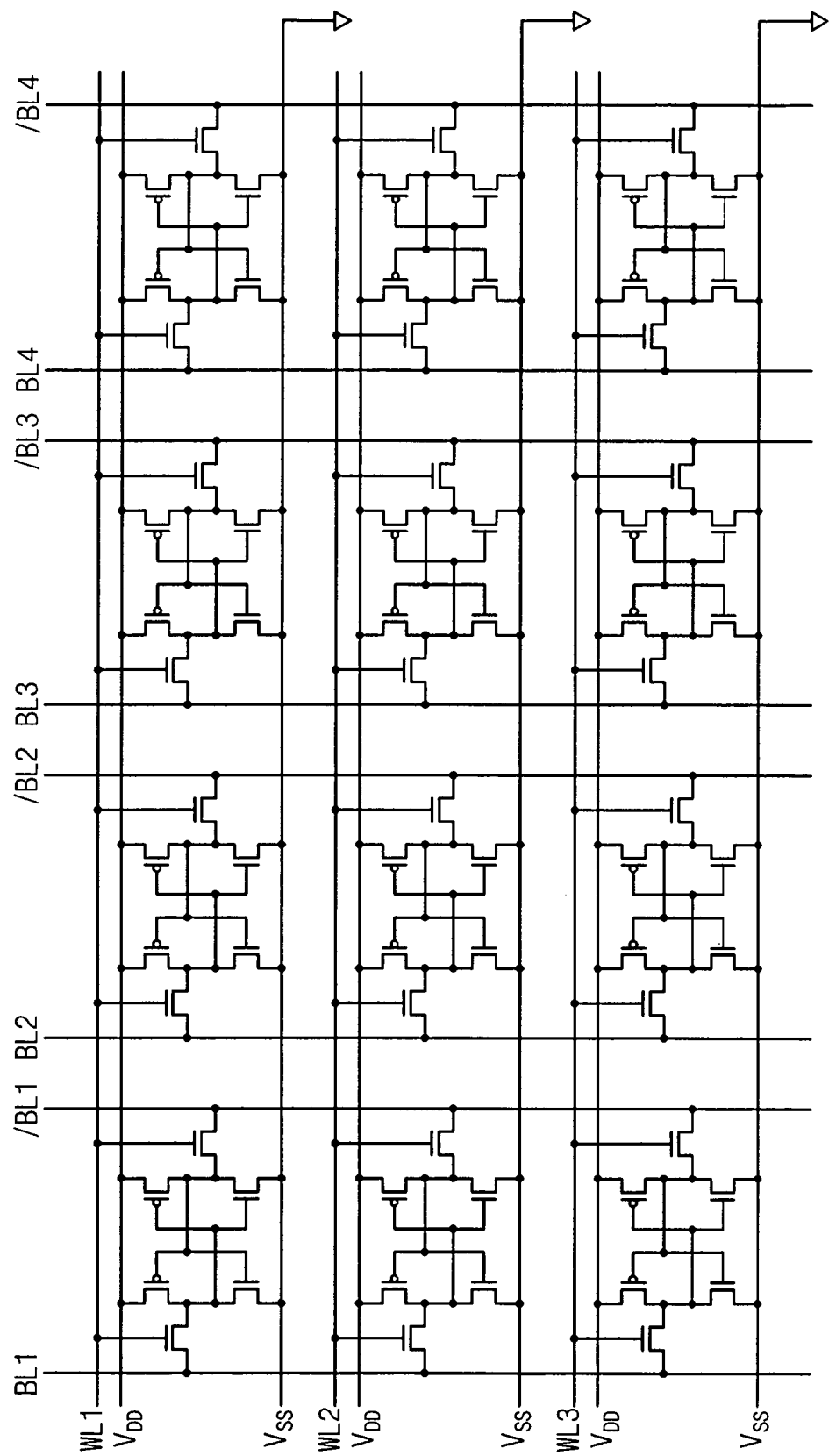
FIG. 8 is a circuit diagram of a general SRAM cell array.

Referring to FIGS. 2A through 2C, the analytic structure of the present invention includes CMOS SRAM cells having an array structure illustrated in FIG. 8, which is formed on a semiconductor substrate 100. The CMOS SRAM cell is provided with a pair of driver transistors, a pair of access transistors and a pair of load transistors.

An isolation structure 105 is formed on the semiconductor substrate 100, which defines first active regions 111 and second active regions 112. The isolation structure 105, may be formed, for example, using a conventional isolation technology such as a trench isolation. The first active region 111 may be a rectangular shape of a closed loop and the second active region 112 may be in a shape of capital letter 'H'. The isolation structure 105 is not only allocated between the first active region 111 and the second active region 112 but is also allocated in an internal region of the first active region 111. The drive transistor and the access transistor are arranged in the first active region 111 and the load transistor is arranged in the second active region 112. The access transistor includes a first gate pattern 121 which traverses through a plurality of cells as a gate electrode. The first gate pattern 121 is used for a word line in the CMOS SRAM cell. To this end, the first gate pattern 121 is allocated to traverse over upper regions of the first active regions 111 through the plurality of CMOS SRAM cells.

The drive transistor includes a second gate pattern 122 as a gate electrode and the second gate pattern 122 is also used for a gate electrode of the load transistor. That is, the drive transistor and the load transistor co-use the second gate pattern 122 as the gate electrode. To meet this condition, the second gate pattern 122 is designed to traverse over upper areas through the first and the second active regions 111 and 112.

In the first and the second active regions 111 and 112 disposed at sides of the first and the second gate patterns 121 and 122, impurity regions are allocated, which form source/drain regions of the drive, access and load transistors. A p-type well 101p is formed at the first active region 111 and an n-type well 101n is formed at the second active region 112. In addition, the impurity region 125 formed in the first active region 111 is an impurity region of n-type conductivity and the impurity region 125 formed in the second active region 112 is an impurity region of p-type conductivity. As a result, the drive and the access transistors are NMOS transistors and the load transistor is a PMOS transistor.

Referring to FIGS. 3A through 3D, a first interlayer dielectric layer 130 is formed over the resultant structure in which the drive, the access and the load transistors are formed. In addition, contact plugs 135 are formed to penetrate into the first interlayer dielectric layer 130 so that the contact plugs 135 are contact with the impurity region 125.

First metal patterns are formed on the first interlayer dielectric layer 130 to connect one contact plug to another. The first metal patterns constitute a power voltage $V_{DD}$ line 141, a ground voltage $V_{SS}$ line 142, a local interconnection 143 and a first pad 144. The power voltage line 141 is electrically connected to the impurity region 125 of the load transistor, while traversing over a middle portion of the second active region 112. The ground voltage line 142 is electrically connected to the source region 125 of the drive transistor formed between the second gate patterns 122, while traversing over the first active region 111. The local interconnection 143 connects the second gate pattern 122 to the impurity regions 125 of the drive and the load transistors so that a pair of drive transistors and a pair of load transistors may constitute an inverter. The first pad 144 is electrically connected to the impurity region 125 of the access transistor through the contact plugs 135 formed between the first gate patterns 121.

According to embodiments of the present invention, a second, a third, a fourth and a fifth interlayer dielectric layers 150, 170, 190 and 210 are formed sequentially on the resultant structure in which the first metal patterns 141, 142, 143 and 144 are formed. The interlayer dielectric layer 130, 150, 170, 190 and 210 is formed, for example, of a silicon oxide layer or a low-k dielectric layer.

Second metal patterns 161, 162, 163 and 164 are formed on the second interlayer dielectric layer 150 and third metal patterns 182, 183, 183' and 184 are formed on the third interlayer dielectric layer 170. Likewise, fourth metal patterns 203, 204 and 204' are formed on the fourth interlayer dielectric layer 190 and fifth metal patterns 224 are formed on the fifth interlayer dielectric layer 210. Herein, the second metal patterns 161, 162, 163 and 164 are connected to first via plugs 155 which penetrate into the second interlayer dielectric layer 150 and the third metal patterns 182, 183, 183' and 184 are connected to second via plugs 175 which penetrate into the third interlayer dielectric layer 170. In addition, the fourth metal patterns 203, 204 and 204'; are connected to third via plugs 195 which penetrate into the fourth interlayer dielectric layer 190 and the fifth metal patterns 224 are connected to fourth via plugs 215 which penetrate into the fifth interlayer dielectric layer 210. The first, the second, the third and the fourth via plugs 155, 175, 195 and 215 are connected to an upper part of each of the first, the second, the third and the fourth metal patterns. The metal patterns and via plugs may be formed of tungsten, aluminum, copper, titanium nitride, titanium, tantalum, tantalum nitride or polysilicon.

Meanwhile, the cell transistor of the CMOS SRAM is formed using a process having a large process margin. The process margin denotes a margin for process conditions capable of preventing failures in each unit process. Therefore, as the process margin becomes large, the likelihood of process failures are minimized. On the contrary, as the process margin is reduced, the likelihood of process failures is increased. Although there are various ways to increase the process margin, the most straightforward one is to increase the design rule. That is, technical problem incurred in a photolithography, an etch process and a deposition process may be addressed by increasing width or area of the design patterns.

As described above, in the case of forming the cell transistor through the process of the large process margin, it is possible to prevent failures which otherwise could be generated in the cell transistor. Therefore, if arbitrary failures are generated in the analytic region 21, 22, 23 and 24, a conclusion can be reached that the failures are not generated in the cell transistors but rather in the interconnections.

Figure 4A:
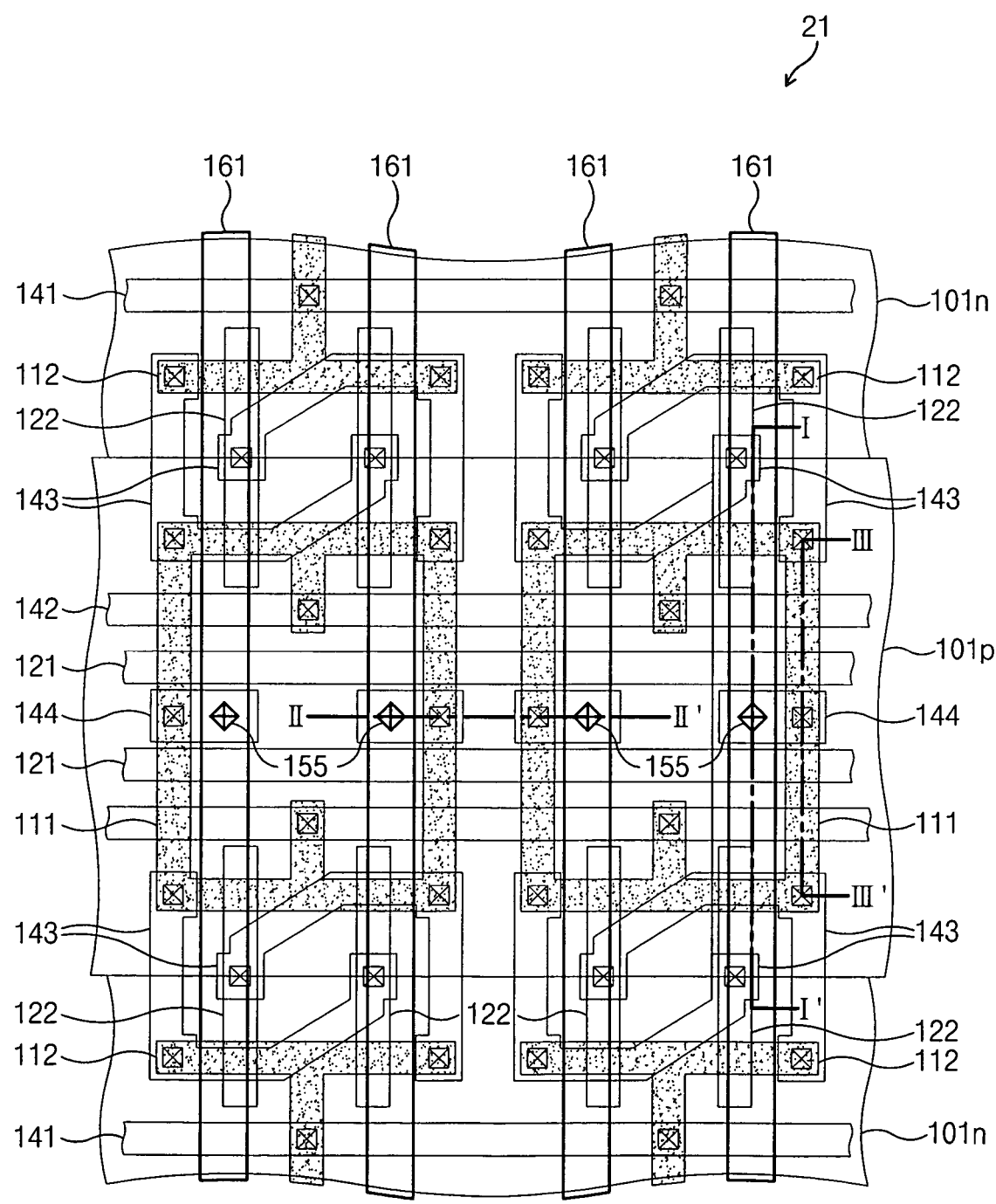
Figure 4B:
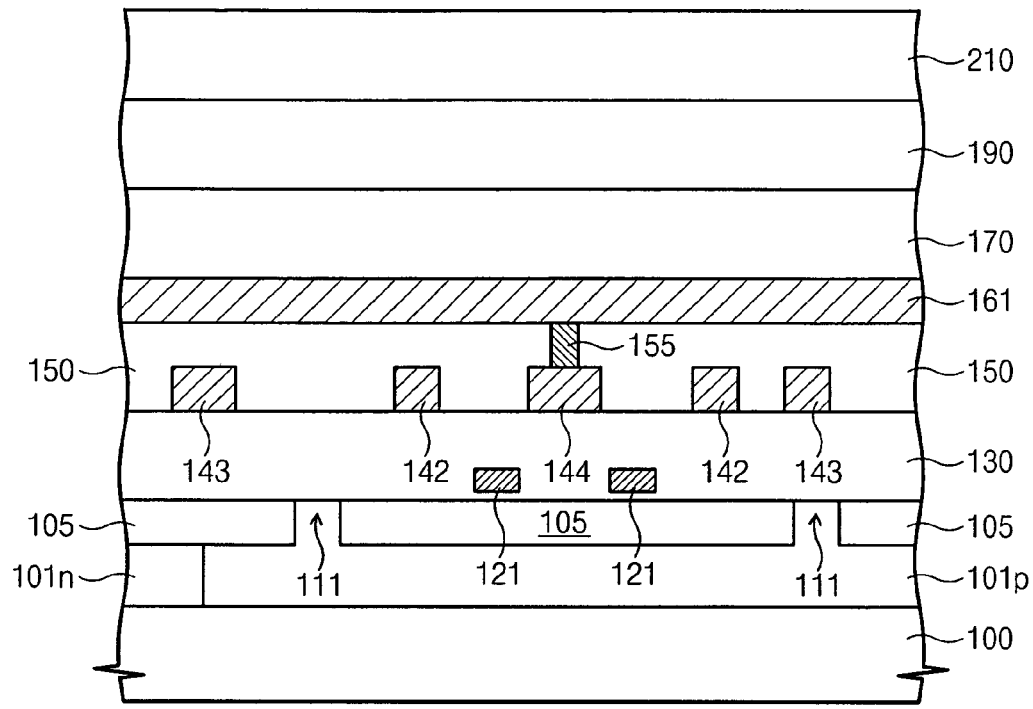
Figure 4C:
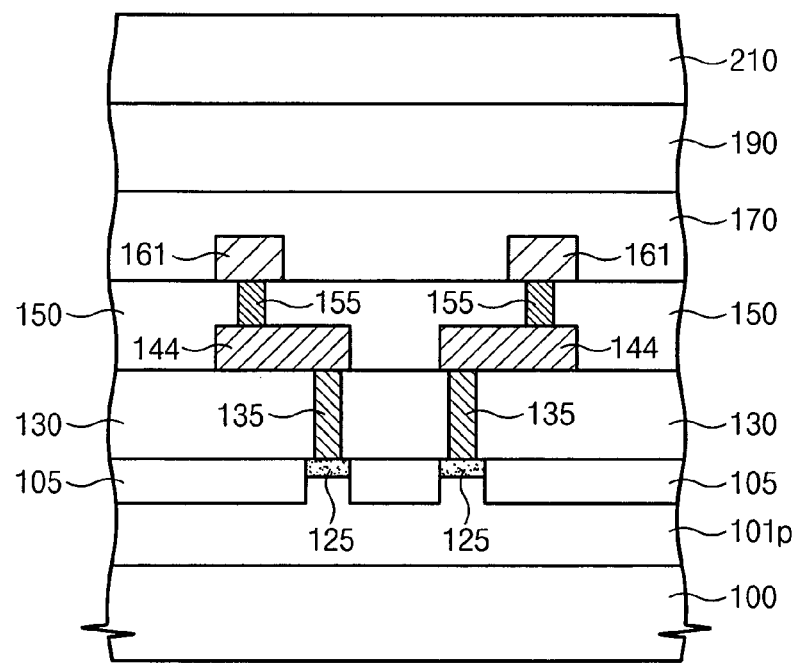

FIGS. 4A through 4C illustrate the first analytic region 21 provided with a standard bit line structure of the CMOS SRAM cell array. Referring to FIGS. 4A through 4C, the second metal pattern 161 disposed in the analytic region 21 is connected to the impurity region 125 of the access transistor through the first via plug 155, the first pad 144, the contact plug 135. As a result, the second metal pattern 161 is formed to be a bit line which connects the SRAM cells, e.g., the access transistors, longitudinally. Accordingly, the third, the fourth, and the fifth metal patterns are not used in the first analytic region 21.

According to the embodiment of the present invention, the second metal pattern 161 and the first via plugs 155 disposed in the first analytic region 21 are formed through a predetermined process having a standard process margin referring to FIG. 9A. In this case, since the cell transistor is formed by using the predetermined process having the large process margin, it can be determined that failures in the first analytic region 21 are much more likely to have been generated during the process of forming the second metal pattern, the process of forming the first via hole or the process of forming the via plug.

Figure 5A:
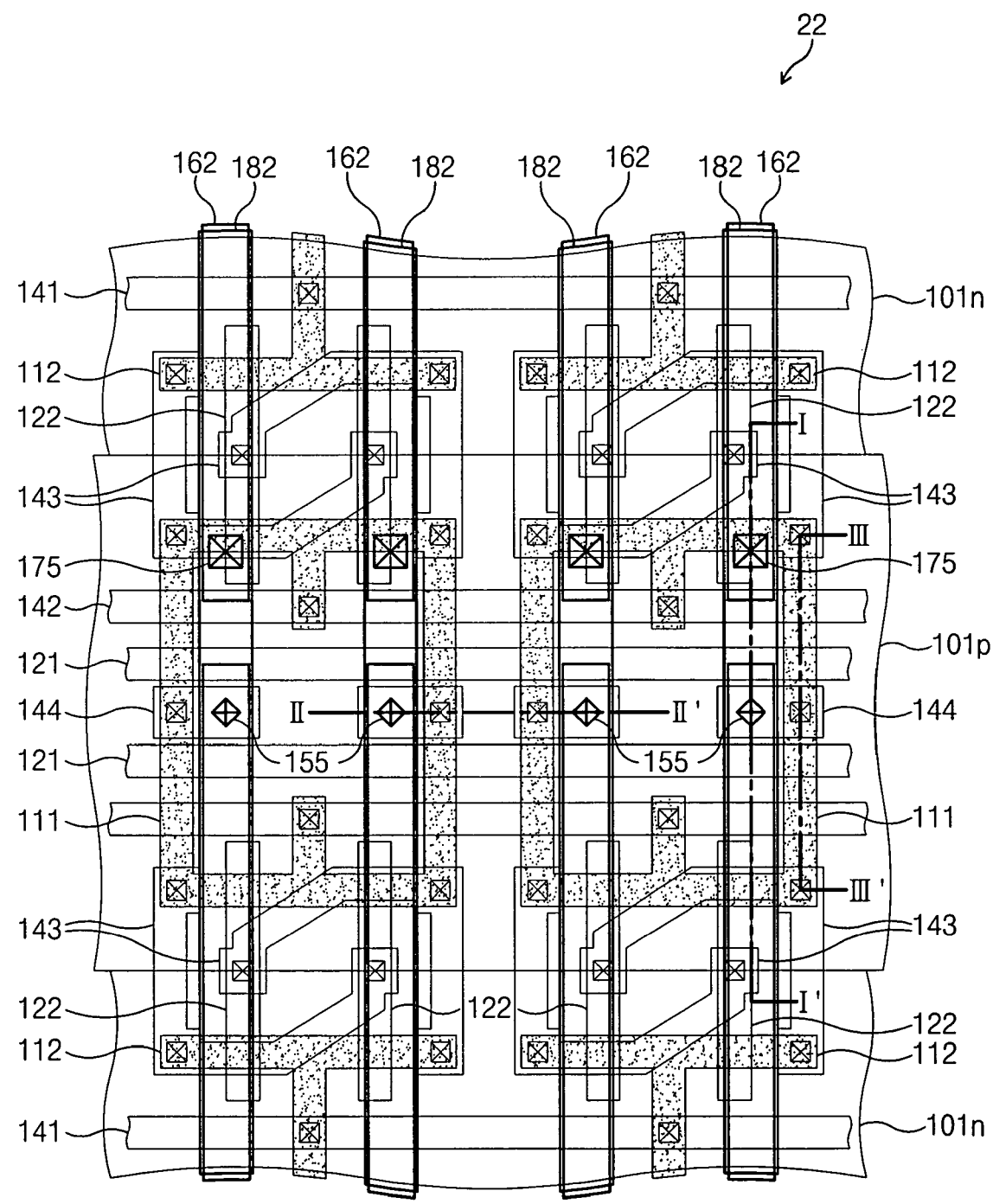
Figure 5B:
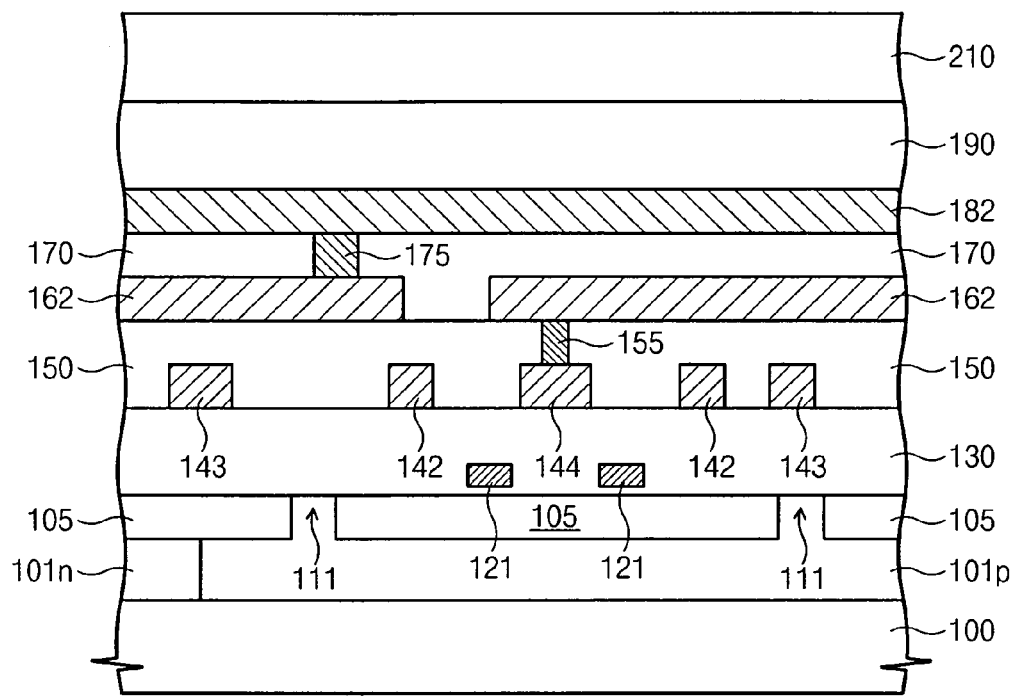
Figure 5C:
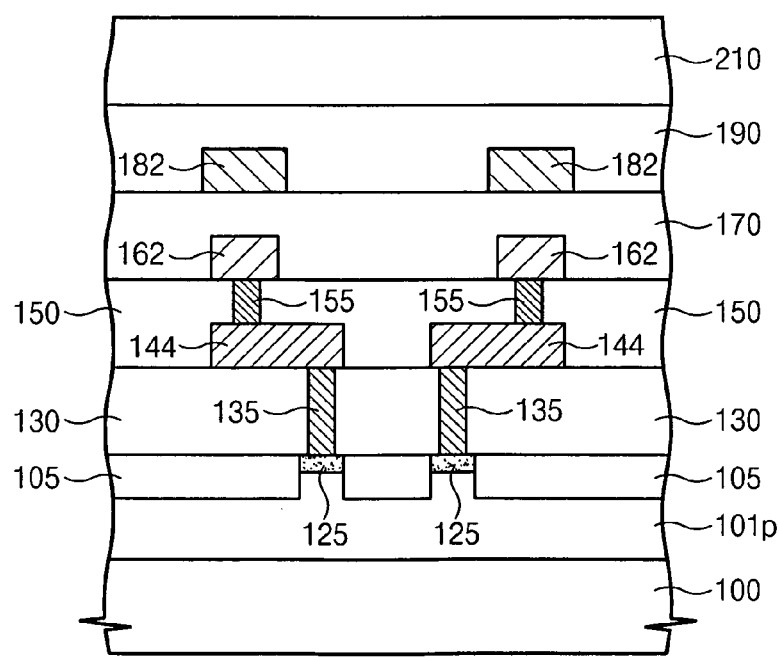

FIGS. 5A through 5C illustrate the second analytic region 22 provided with a modified bit line of the CMOS SRAM cell array. Referring to FIGS. 5A through 5C, the second metal pattern 162 is formed as a landing pad (hereinafter, referred to as a second pad 162) which is connected to one impurity region 125 through the first via plug 155, the first pad 144 and the contact plug 135. Since the second pad 162 is connected to only one impurity region 125, the second pad 162 is different from the second metal pattern 161 of the first analytic region 21 which is connected to a plurality of impurity regions 125.

Meanwhile, the third metal patterns 182 in the second analytic region 22 are formed as a bit line which connects the second pads 162 longitudinally. For this connection, the third metal patterns 182 penetrate into the third interlayer dielectric layer 170 and are connected to the plurality of second via plugs 175 which are connected to the second pads 162.

According to the embodiment of the present invention, the second pad 162 and the first via plugs are formed through a predetermined process having a large process margin while the third metal patterns 182 and the second via plugs 175 are formed through a predetermined process having a standard process margin, referring to FIG. 9B. In order to increase the process margin in the process of forming the second pad 162, the second pad may have a long landing metal structure having a wide area. In addition, in order to increase the process margin in the process of forming the first via plugs 155, it is possible to broaden the width of the first via plug 155 to prevent failures in the patterning process and the filling process. In this case, in consideration of the relationship between the process margin and in the possibility of failure generation, it can be determined that arbitrary failures in the second analytic region 22 are much more likely to have been generated in a process of forming the third metal pattern, a process of forming the second via hole and a process of forming the second via plug.

Figure 6A:
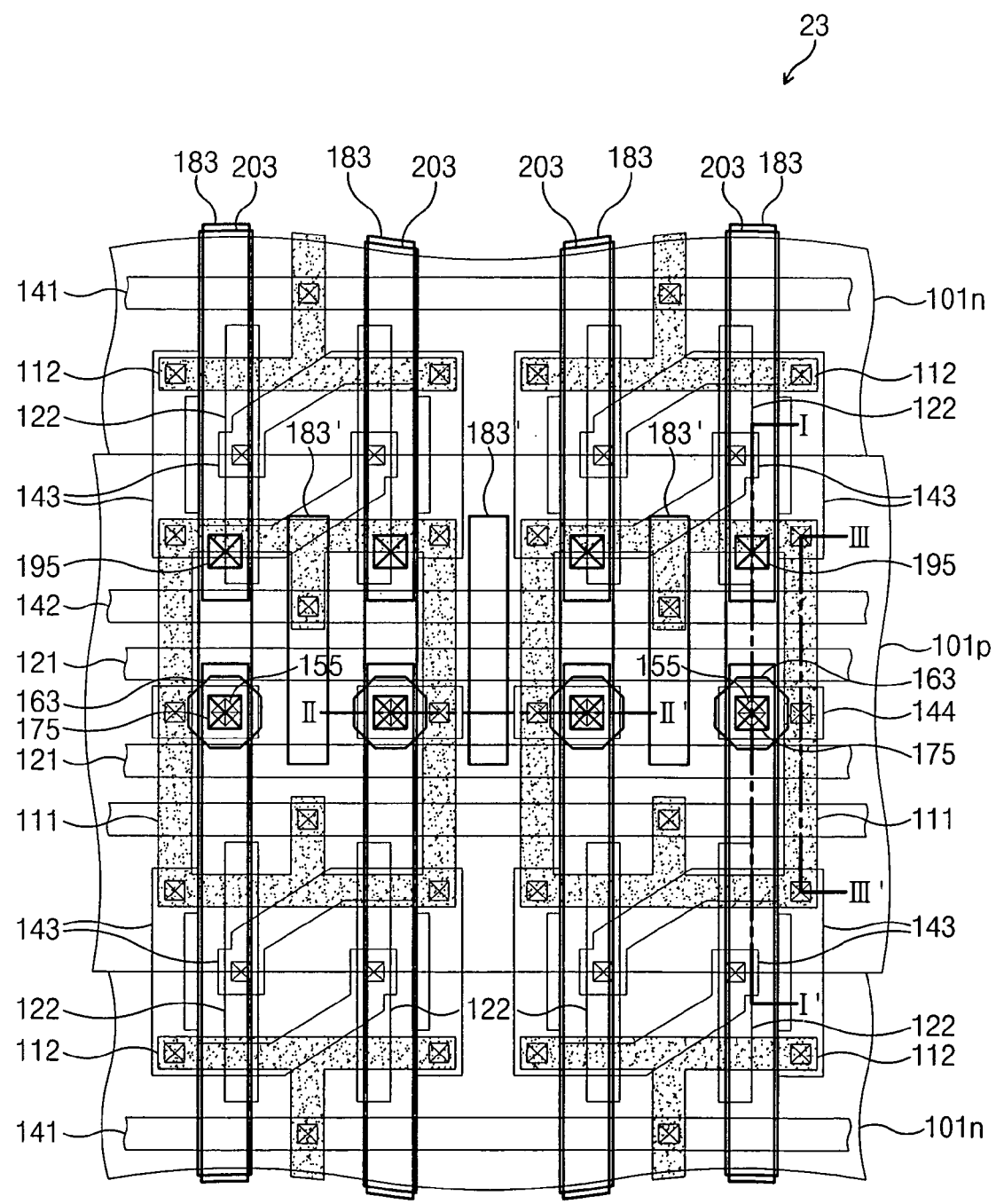
Figure 6B:
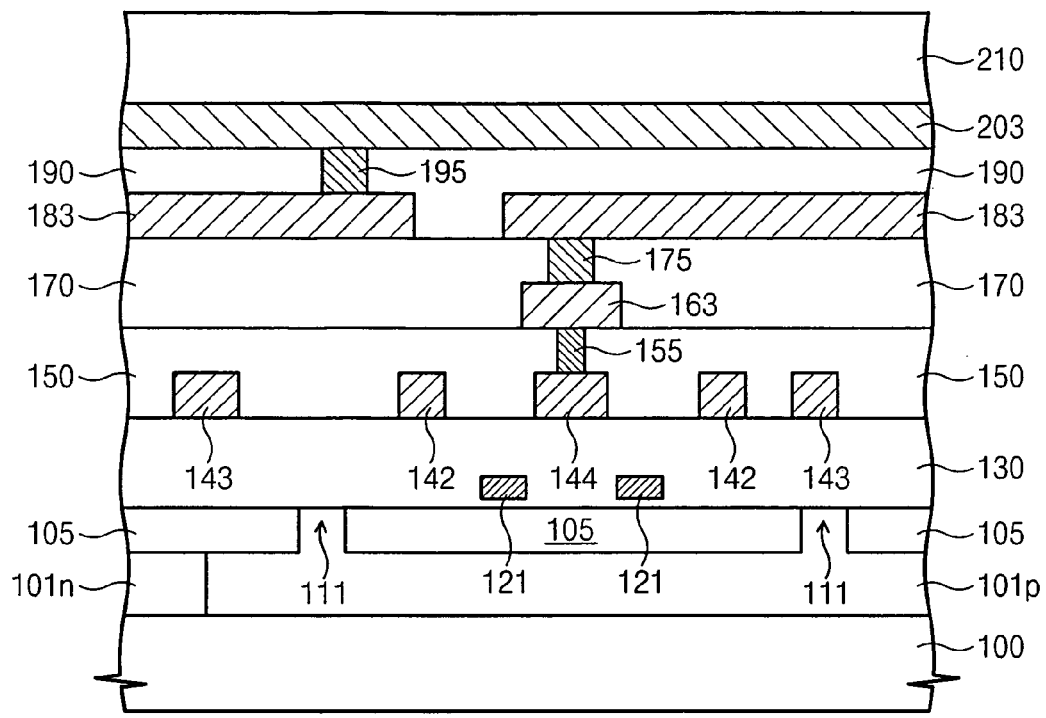
Figure 6C:
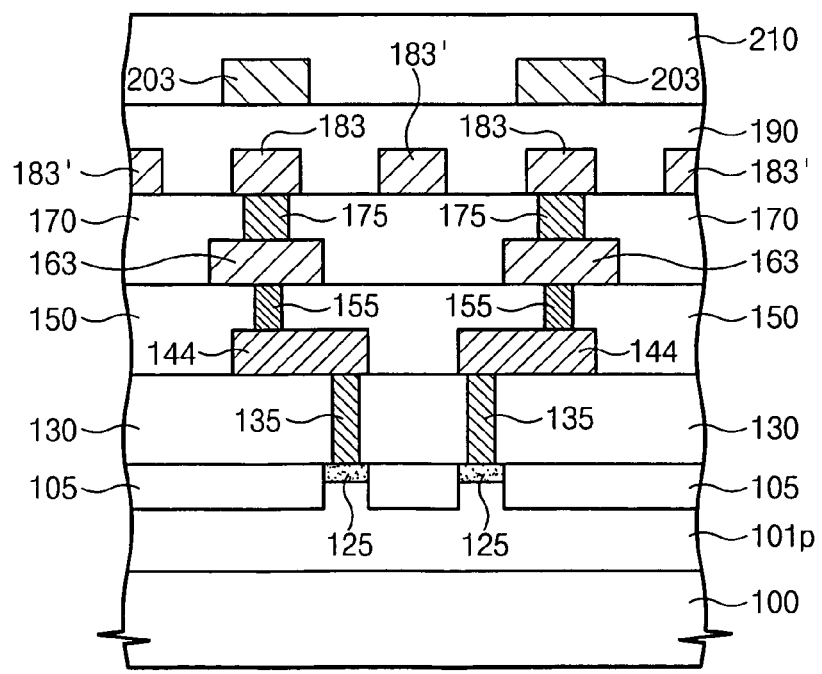

FIGS. 6A through 6C show the third analytic region 23 provided with a modified bit line of the CMOS SRAM cell array. Referring to FIGS. 6A through 6C, the second metal patterns 163 and the third metal pads 183 are used as landing pads respectively in the third analytic region 23. That is, the second metal patterns 163 are formed to be a landing pad (hereinafter, referred to as a second pad) which is connected to one impurity region 125 through the first via plug 155, the first pad 144 and the contact plug 135. In addition, the third metal patterns 183 are formed to be a landing pad (hereinafter, referred to as a third pad 183) which is connected to one impurity region 125 through the second via plug 175, the second pad 163, the first via plug 155, the first pad 144 and the contact plug 135. At this time, the third pad 183 may be formed of a long landing metal identical to the second pad 162 of the second analytic region 22.

Meanwhile, the fourth metal patterns 203 are formed to be a bit line which connects the third pads 183 longitudinally in the third analytic region 23. For this connection, the fourth metal patterns 203 penetrate into the fourth interlayer dielectric layer 190 and they are connected to the third via plugs which are connected to the third pads 183.

According to the embodiment of the present invention, the first, the second and the third pads 144, 163 and 183 and the first and the second via plugs 155 and 175 are formed through a predetermined process having a large process margin. Furthermore, the fourth metal patterns 203 and the third via plugs 195 are formed in the third analytic region 23 through a predetermined process having a standard process margin, referring to FIG. 9C. In this case, in consideration of the relationship between the process margin and the possibility of failure generation, it can be determined that arbitrary failures in the third analytic region 23 are much more likely to have been generated in a process of forming the fourth metal pattern, a process of forming the third via hole or a process of forming the third via plug.

Figure 7A:
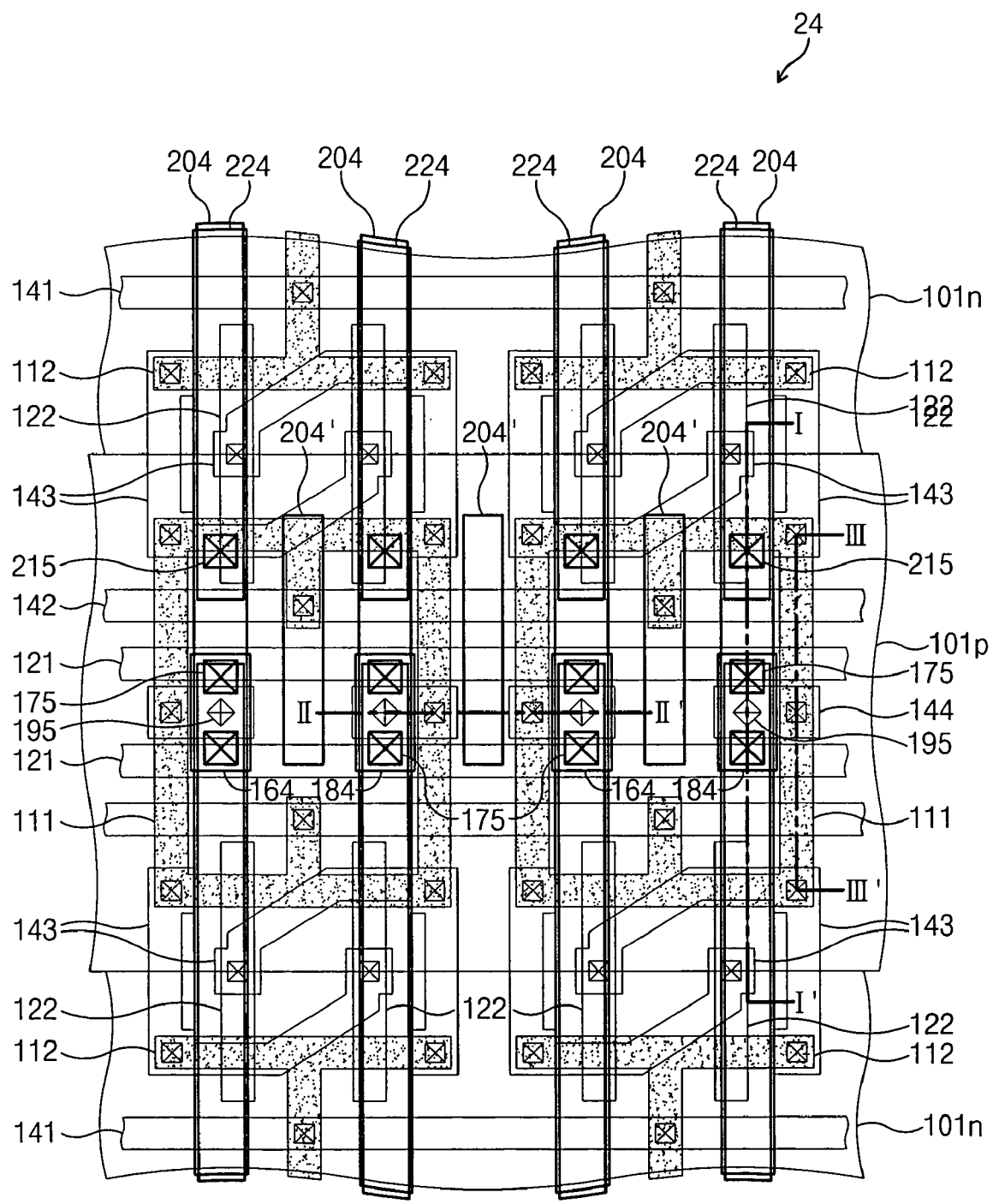
Figure 7B:
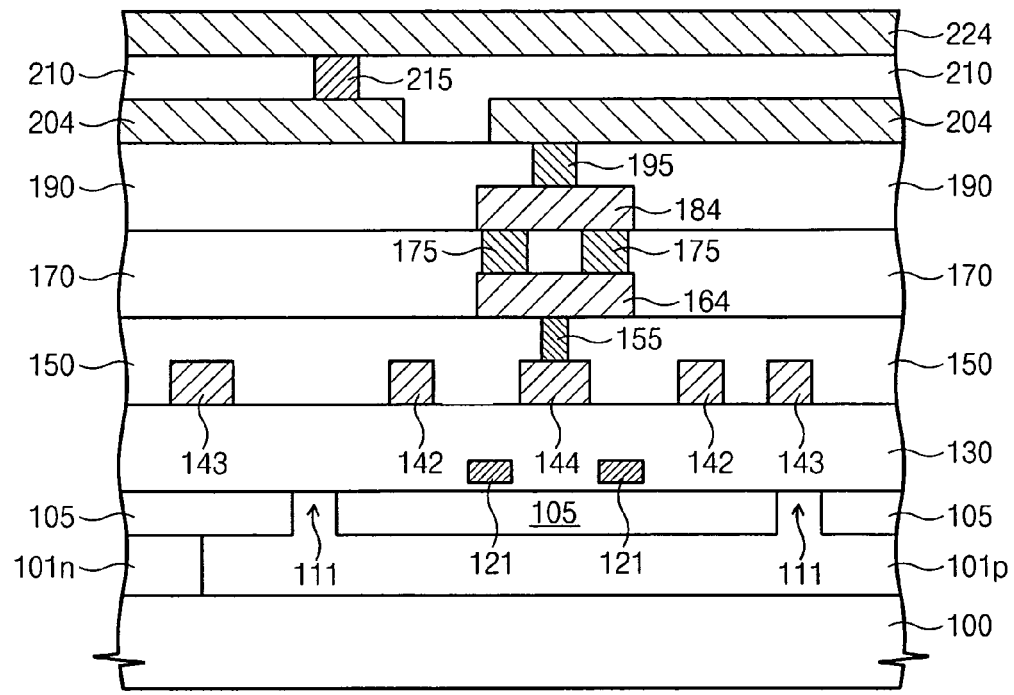
Figure 7C:
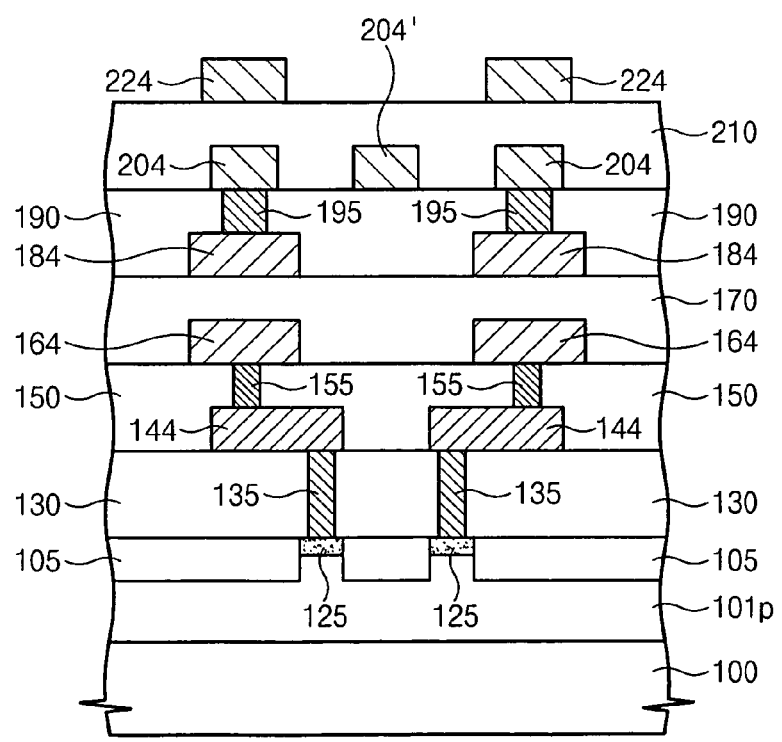

FIGS. 7A through 7C illustrate the fourth analytic region 24 provided with a modified bit line of the CMOS SRAM cell array. Referring to FIGS. 7A through 7C, the second, the third and the fourth metal patterns 164, 184 and 204 are used as a landing pad respectively. That is, the second metal pattern 164 is formed to be a landing pad (hereinafter, referred to as a second pad 164) which is connected to one impurity region 125 through the first via plug 155, the first pad 144 and the contact plug 135. In addition, the third metal patterns 184 in the fourth analytic region 24 are formed to be a landing pad (hereinafter, referred to as a third pad 184) which is connected to one of the second pads 164 through the second via plug. In addition, the fourth metal patterns 204 are formed to be a landing pad which is connected to one of the third pads 184 through the third via plug 195.

At this time, one of the first, the second, the third and the fourth 144, 164, 184 and 204 may be formed to be a long landing metal structure identical to the second pad 162 of the second analytic region 22. Moreover, the first, the second and the third via plugs 155, 175 and 195 may have a stack via structure or multi-via structure. In detail, the stack via structure is structured in a manner that an upper via plug, e.g., the second via plug 175, is disposed directly above a lower via plug, e.g., the first via plug 155. The multi-via structure is structured in a manner that a plurality of via plugs are formed at one landing pad. As the area of the landing pad is increased, the multi-via structure may be formed with ease so that it is an adoptable method for reducing the possibility of failure generation in the process of forming the via. That is, the multi-via structure increases the process margin in the process of forming the via plug.

Meanwhile, the fifth metal pattern 224 in the fourth analytic region is formed to be a bit line which connects the fourth pads 183 longitudinally. For this connection, the fifth metal pattern 224 penetrates into the fifth interlayer dielectric layer 210 and is electrically connected to a plurality of fourth via plugs 215 which are connected to the fourth pads 204.

According to the embodiment of the present invention, the first, the second, the third and the fourth pads 144, 164, 184 and 204 and the first, the second and the third via plugs 155, 175 and 195 are formed through a process having a large process margin. Whereas, the fifth metal patterns 224 and the fourth via plugs 215 formed in the fourth analytic region 24 are formed through a process having a standard process margin, referring to FIG. 9D. In this case, in consideration of the relationship between the process margin and the possibility of failure generation, it can be determined that arbitrary failures in the fourth analytic region 24 are much more likely to have been generated in a process of forming the fifth metal pattern, a process of firming the fourth via hole or a process of firming the fourth via plug.

Figure 10:
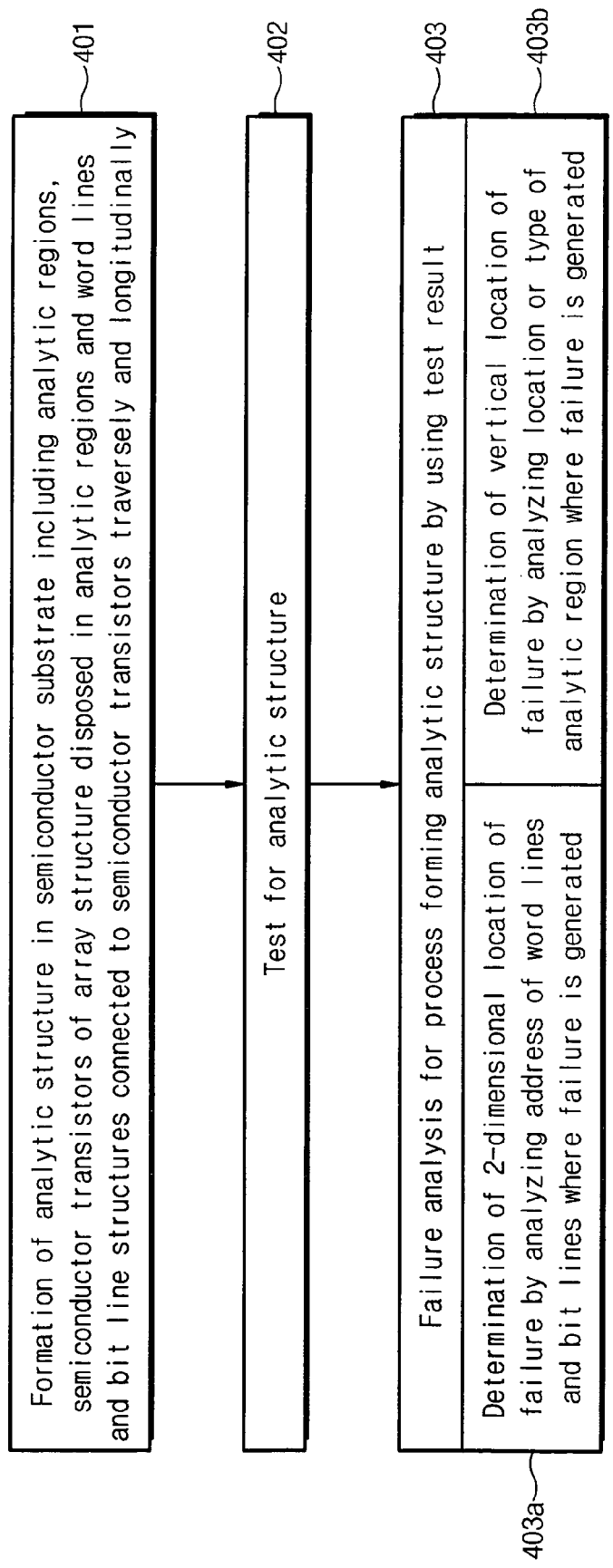
FIG. 10 is a flow chart illustrating a failure analysis method according to an embodiment of the present invention.

In summary, the analytic structures are formed in the first, the second, the third and the fourth analytic regions 21, 22, 23 and 24, wherein one analytic structure has a different height in number of layers, and a different structure, from the others, for example by including a number of different interconnect layers. In order to analyze each of metal layers constituting the interconnection structures of a predetermined semiconductor device according to vertical locations, the interconnection in each region is formed at a predetermined layer height and its structure is different from other interconnections. In each analytic region, while a predetermined metal layer is formed using a process having a standard or reduced process margin, the remaining elements of the analytic region are formed using a relatively large process margin. Accordingly, the likelihood of failure generation can be confined to the selected process of forming the metal layer so that it is readily determine the vertical location of the failure, which is depicted by reference numeral 403b in FIG. 10.

A horizontal location of the source of failures that are generated can be determined through the address of the failure generation. In addition, the location of the failure may be readily determined by the locations of the word line and the bit line where the failures are generated in each region, which is depicted by reference numeral 403a in FIG. 10.

For example, it is further possible to create a failure map which represents the horizontal location of the failure after carrying out a predetermined a memory test by connecting a predetermined test device to the word lines and the bit lines. When the locations of the failures are determined, as described above, it is possible to isolate, or cut-off, a predetermined portion of the semiconductor substrate incorporating therein the accurate location of the failure by using a focused ion beam (FIB). In this case, an erroneous failure analysis is minimized.

Furthermore, according to the embodiment of the present invention, since the cell array formed in the analytic regions 21, 22, 23 and 24 are configured with CMOS SRAM cell transistors. the types of failures can be readily presumed based on the inherent structure of the SRAM cell array. That is, provided that all cells connected to a predetermined bit line in the failure map produce failures, it can be assumed that a circuit state of the bit line is open or short. Likewise, provided that all the cells connected to a predetermined word line in the failure map produce failures, it can be assumed that a failure, e.g., particularly a short failure, is generated with regard to the first gate pattern 121. In addition, when the failures are generated in the contact plug 155, the active regions 111 and 112, or the second gate patterns 122, such failures are represented as isolated, one-bit type failures in the failure map.

According to the embodiment of the present invention, the first pads 144 are commonly connected to two adjacent SRAM cells. Therefore, in case that the bit line is not connected to the impurity region 125 in each analytic region 21, 22, 23 and 24, failures of 2-bit column type are generated together in both adjacent cells. For instance, if the failures of 2-bit column type are generated at a predetermined location of the third analytic region, it is assumed that the causes of the failures are related to the third via plug 175. Since the third analytic region 23 is a region where the process margin is controlled for evaluating the third via plug 175 and the fourth metal pattern 183, the failures generated in the third analytic region 23 can be assumed to be associated with the failures of the third via plug 175 or the fourth metal pattern 183. At this time, when the failures of 2-bit column type are generated, it is assumed that the failures are generated in the interconnection structure, i.e., the third via plug 175, which connects the bit line, i.e., the fourth metal pattern 183, to the impurity region 125. For verification, it is necessary to secure visual information with regard to the horizontal location of the cut section where the failures have been generated. It is possible to readily secure the visual information with regard to the cut section by using the array structure described above.

According to the conventional approach, as the number of the layers in the interconnection structure is increased, it is increasingly difficult to determine accurate vertical locations of the failures. In contrast, the present invention is useful for analyzing the failures of the interconnection structures in the semiconductor device such as a central processing unit (CPU) which is configured with a plurality of metal patterns. Meanwhile, the structure of each analytic region and the process margin applied to the failure analysis may be changed according to various process conditions.

Figure 11A:
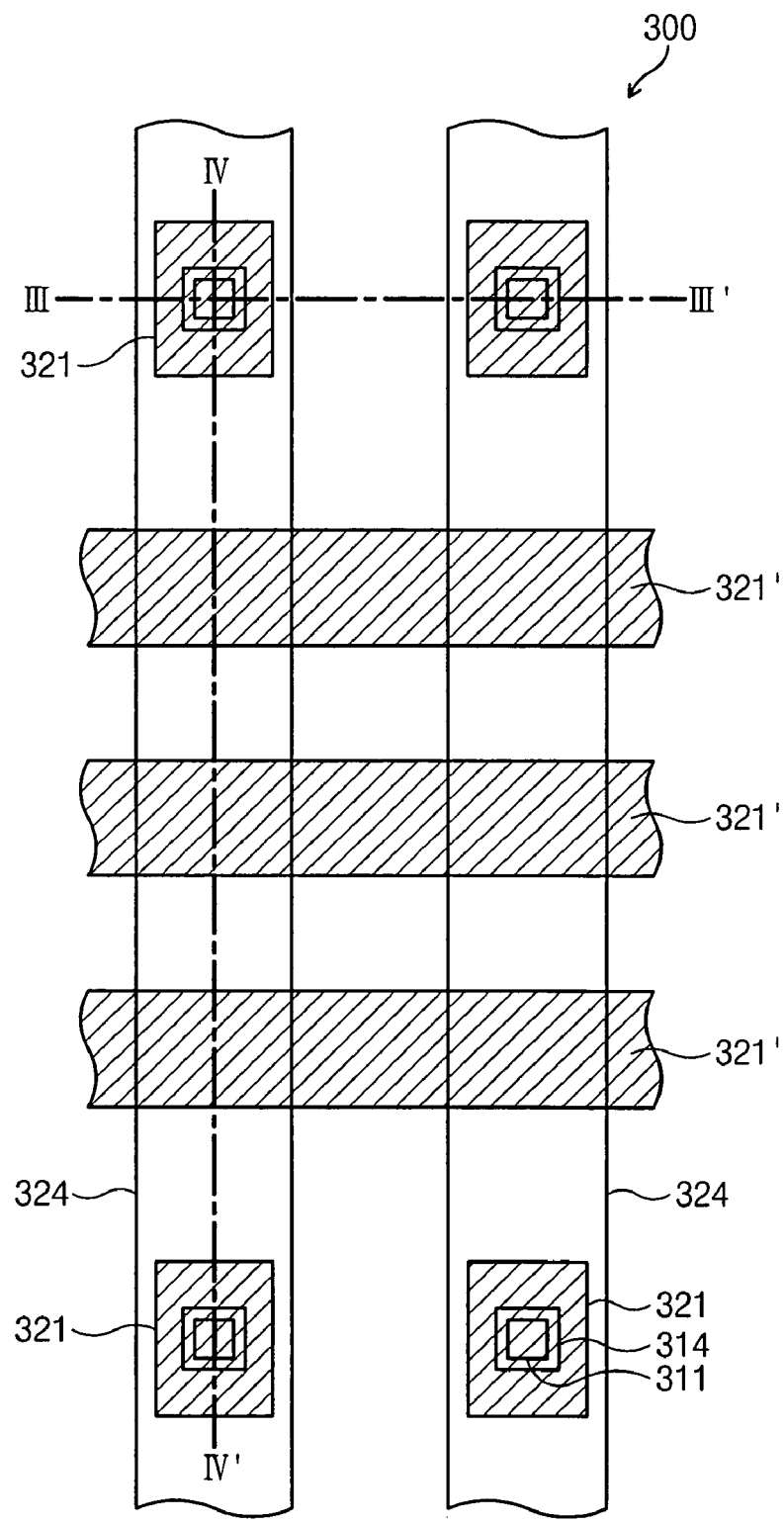
FIG. 11A is a plane view of an interconnection structure according to an embodiment of the present invention.
Figure 11B:
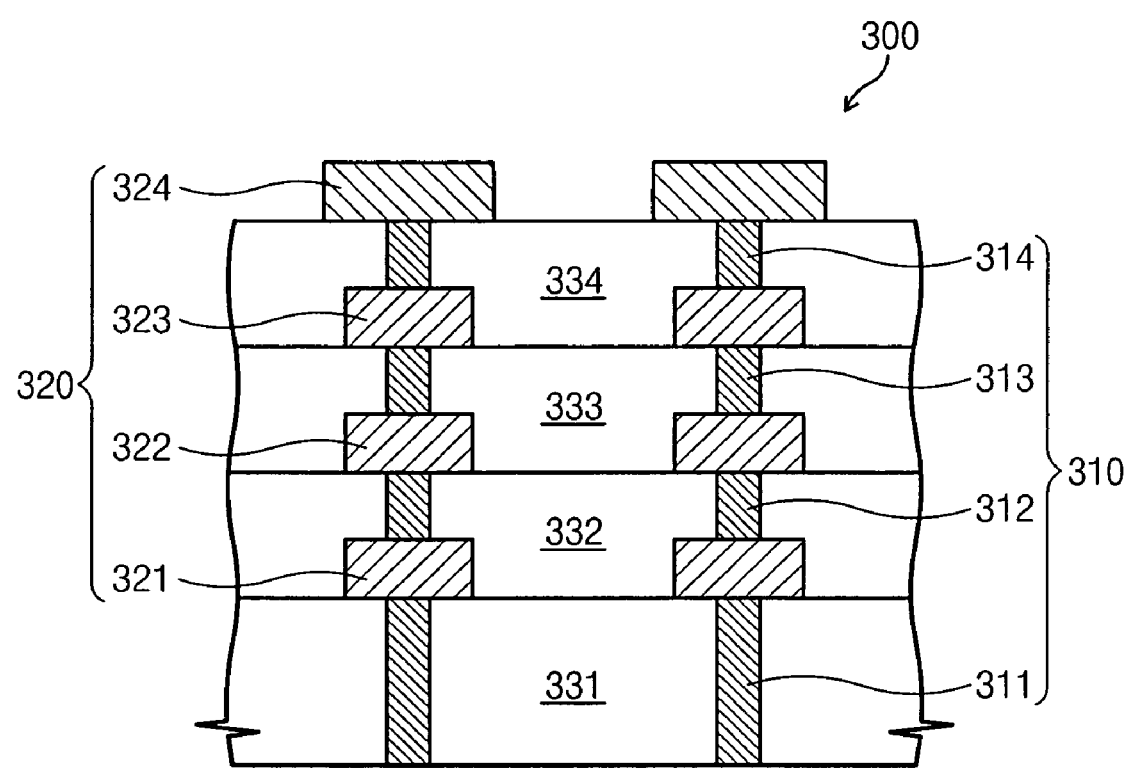

FIG. 11A is a plane view of the interconnection structure according to another embodiment of the present invention. FIGS. 11B and 11C are cross sectional views taken along line III-III' and line IV-IV' of FIG. 11A, respectively.

An interconnection structure 300 of this embodiment may be used as a word line, a bit line or source line. The word line is connected to gate electrodes of cell transistors formed in each analytic region. The bit line is connected to drain electrodes and the source line is connected to source electrodes. In addition, the analytic structure 300 according to the present embodiment may be connected to various kinds of semiconductor cell arrays such as a DRAM cell array, a flash cell array as well as the aforementioned SRAM cell array.

The interconnection structure 300 is provided with a plurality of plugs having multi-layer structures, wherein the plugs are connected to at least one of the gate electrodes, the source electrodes or the drain electrodes of the cell array transistors formed in the analytic region. Referring to the embodiment illustrated in FIGS. 11 through 13, the interconnection structure 300 is provided with a first, a second, a third and a fourth plugs which are stacked in sequence, wherein the first plug 311 is connected to at least one of the electrodes of the cell arrays.

Upon top surfaces of the first through the fourth plugs 311, 312, 313 and 314, a first, a second, a third and a fourth metal patterns 321, 322, 323 and 324 are formed, which are used for pads or signal lines. The pads are interposed between plugs in different layers to electrically connect to each other, and the signal lines transfer electrical signal such as gate voltage, source voltage or bit line voltage to the plugs. According to the present invention, the first, the second and the third metal patterns 321, 322 and 323 correspond to pads and the fourth metal pattern 324 corresponds to the signal line.

Meanwhile, the first through the fourth plugs 311, 312, 313 and 314 may be formed to have a stacked via structure or multi-via structure. Herein, the stacked via structure is a structure where an upper plug is formed over a lower plug and the multi-via structure is a structure where a plurality of plugs are formed over an underlying metal pattern. Between the plugs 311, 312, 313 and 314 and the metal patterns 321, 322, 323 and 324, interlayer dielectric layers 331, 332, 333 and 334 are formed respectively so as to support these structures and electrically isolate neighboring structures.

According to the embodiments, the plugs and the metal patterns constituting the interconnection structure 300 have different number of layers and interconnection structures according to the location of the analytic region where the interconnection structure is formed. In conclusion, there is formed a plurality of interconnection structures in the analytic structures which are connected to the cell array of the same structure, wherein each interconnection structure has a number of layer and/or a structure that is different from the others. Therefore, it is possible to determine the vertical locations of the failures by analyzing the failures generated in the interconnection structure, which are varied by location of the analytic region. In addition, the horizontal location of the failure generation may be determined by analyzing the address of the cell array selected using the interconnections.

Figure 12A:
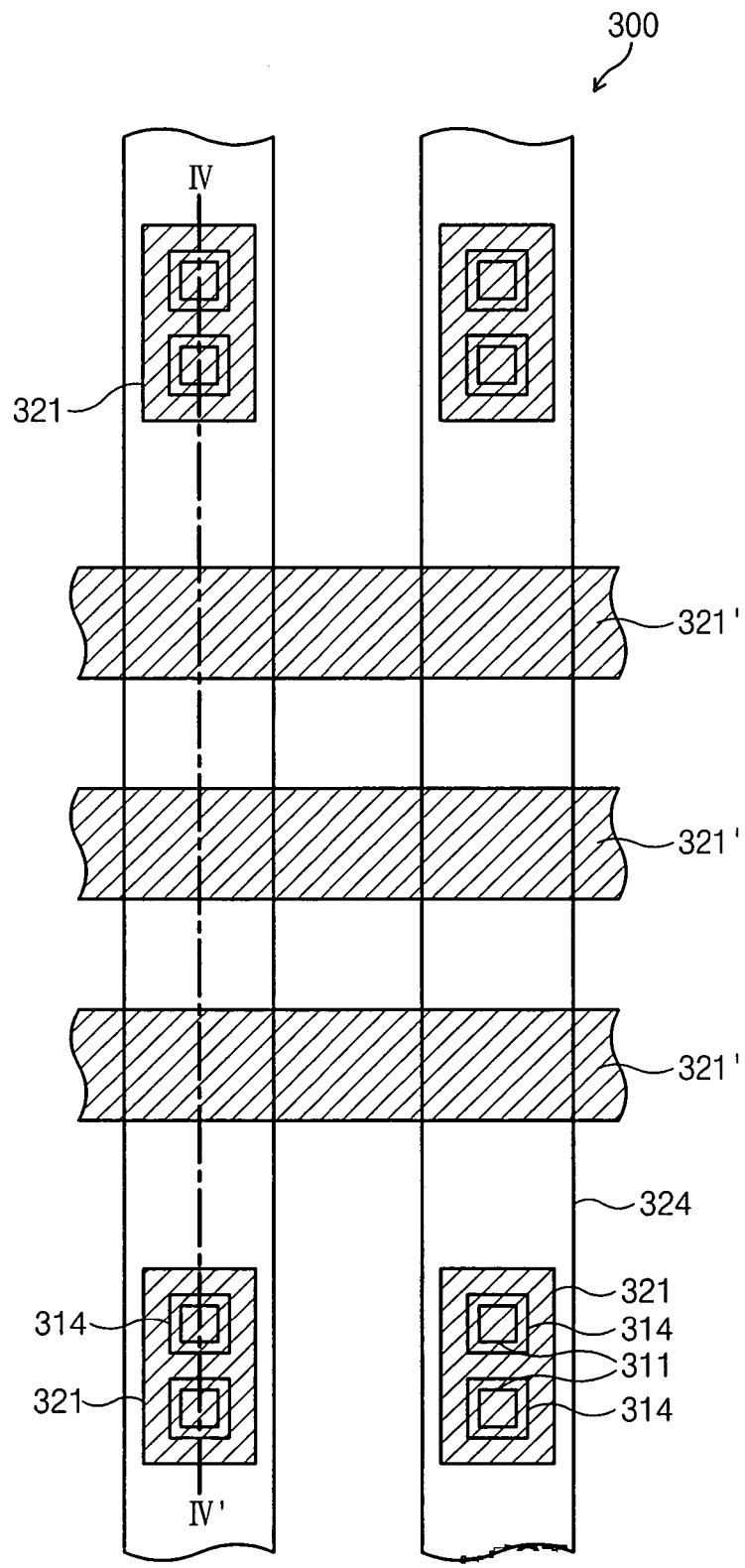
FIG. 12A is a plane view of an interconnection structure according to another embodiment of the present invention.

In order to determine the vertical location of the failure efficiently, different design rules may be applied to the plugs and the metal patterns according to the location of the analytic region. For example, the areas of the metal patterns formed at a predetermined layer can be adjusted in order to control the process margin according the location of the analytic region, as described above in conjunction with the first embodiment of FIGS. 2 through 9. Meanwhile, FIGS. 12A and 12B are an interconnection structure 300 of the multi-via structure for increasing the process margin according to further another embodiment of the present invention.

According to the present invention, the 2-dimensional location and the vertical location of the failures generated in the semiconductor device having multi-stacked interconnections therein can be readily determined. Accordingly, it is possible to analyze the interconnection failures rapidly and accurately. As a result, a development period for the semiconductor device is further minimized.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An analytic structure for failure analysis of a semiconductor device, comprising:

first and second analytic regions arranged in a semiconductor substrate;

first and second array structures arranged in the first and second analytic regions, respectively, and the first and second array structures comprising a plurality of semiconductor transistors; and first and second interconnection structures formed respectively on the first and second analytic regions to connect the semiconductor transistors, each of the first and second interconnection structures comprising multiple layered metal patterns and multiple layered plugs interposed between the multiple layered metal patterns, wherein each of the first and second interconnection structures has a weak portion, in which the metal patterns and the plugs are formed through a predetermined process having a standard process margin, wherein the metal patterns and plugs of the other portions within the analytic region are formed through a predetermined process having a large process margin relative to the standard process margin, and the weak portions of the first and second interconnection structures are formed at different levels with respect to each other.

2. The analytic structure of claim 1 wherein a plug is disposed vertically over another underlying plug in at least one analytic region thereby forming a stacked via structure.

3. The analytic structure of claim 1, wherein the first and second interconnection structures include word line structures connected to gate electrodes of the semiconductor transistors.

4. The analytic structure of claim 1, wherein the first and second interconnection structures include source line structures connected to source electrodes of the semiconductor transistors.

5. The analytic structure of claim 1, wherein the first and second interconnection structures include drain line structures connected to drain electrodes of the semiconductor transistors.

6. The analytic structure of claim 1, wherein the semiconductor transistors are formed of an SRAM (static random access memory) cell array, each cell comprising two load transistors, two drive transistors and two access transistors.

7. The analytic structure of claim 1, wherein the plugs comprise multi-via structures where a plurality of plugs are disposed over the underlying metal pattern in at least one analytic region.

8. The analytic structure of claim 1, wherein an area of a metal pattern formed at a predetermined layer of an analytic region is determined according to a location of the analytic region.

9. The analytic structure of claim 1, wherein the first and second interconnection structures have a single via structure in the weak portion and a multi-via structure in the other portions.

* * * * *

UNITED STATES PATENT AND TRADEMARK OFFICE
CERTIFICATE OF CORRECTION

PATENT NO. : 7,598,615 B2  Page 1 of 1
APPLICATION NO. : 11/346678
DATED : October 6, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 836 days.

Signed and Sealed this

Twenty-eighth Day of September, 2010

David J. Kappos
*Director of the United States Patent and Trademark Office*